United States Patent
Nakamura et al.

(10) Patent No.: US 6,891,491 B2
(45) Date of Patent: May 10, 2005

(54) METHOD AND APPARATUS FOR CORRECTION OF A/D CONVERTED OUTPUT DATA

(75) Inventors: Mitsuo Nakamura, Kariya (JP); Takamoto Watanabe, Kariya (JP); Sumio Masuda, Gyoda (JP)

(73) Assignee: DENSO Corporation, Kariya (JP)

( * ) Notice: Subject to any disclaimer, the term of this patent is extended or adjusted under 35 U.S.C. 154(b) by 0 days.

(21) Appl. No.: 10/791,649

(22) Filed: Mar. 2, 2004

(65) Prior Publication Data

US 2004/0177102 A1 Sep. 9, 2004

(30) Foreign Application Priority Data

Mar. 5, 2003 (JP) ........................................ 2003-058844

(51) Int. Cl.[7] .............................................. H03M 1/12
(52) U.S. Cl. ...................................... 341/155; 341/118
(58) Field of Search ................................ 341/155, 156, 341/118, 166, 157

(56) References Cited

U.S. PATENT DOCUMENTS 5,396,247 A   3/1995  Watanabe et al.
5,848,383 A * 12/1998  Yunus ........................ 702/104
6,466,151 B2 * 10/2002  Nishii et al. ................ 341/155
2003/0195910 A1 * 10/2003  Corless et al. .............. 708/322

FOREIGN PATENT DOCUMENTS

JP          5-259907       10/1993
JP          10-145231       5/1998

* cited by examiner

*Primary Examiner*—Jean Jeanglaude
*Assistant Examiner*—John B Nguyen
(74) *Attorney, Agent, or Firm*—Harness, Dickey & Pierce, PLC

(57) ABSTRACT

A method for correcting A/D converted output data which corrects digital data obtained by A/D conversion of an analog signal, comprising forming an at least first order polynomial curve approximating an input/output characteristic curve of A/D conversion in a range of input of the analog signal, setting an ideal input/output characteristic line of A/D conversion, deriving a conversion equation for converting coordinates of a point on the approximation polynomial curve to a point of the ideal input/output characteristic line for the same analog signal value, and using this conversion equation to convert A/D converted digital data so as to correct non-linearity of the output data.

20 Claims, 18 Drawing Sheets

METHOD AND APPARATUS FOR CORRECTION OF A/D CONVERTED OUTPUT DATA

BACKGROUND OF THE INVENTION

1. Field of the Invention

The present invention relates to a method and apparatus for linear correction of the non-linearity of a digital data output characteristic for an analog signal input to an analog-to-digital (A/D) converter.

2. Description of the Related Art

Known in the past has been an A/D converter provided with a pulse delay circuit comprised of a plurality of inversion circuits connected in a ring and applying the input voltage to be converted to digital data as the power supply voltage of the inversion circuits for A/D conversion of the input voltage utilizing the difference in the delay times of the inversion circuits arising from the power supply voltage (for example, see Japanese Unexamined Patent Publication (Kokai) No. 5-259907).

This type of A/D converter (hereinafter referred to as a "time A/D converter" or "TAD") is comprised of a pulse delay circuit for sending round a start pulse SP, a latch and encoder for detecting (latching) an arrival position of the start pulse in the pulse delay circuit at a rising (or falling) timing of a sampling clock input from the outside and outputting the detection result converted to predetermined bits of digital data expressing what number stage the delay unit through which the start pulse passed is from the head, a counter for counting the number of cycles of the start pulse in the pulse delay circuit, and a latch circuit for latching the count of the counter at the rising (or falling) timing of the sampling clock.

The output characteristic of such a TAD usually has non-linearity. For example, it has an output characteristic bulging upward from the straight line of the desired output characteristic (ideal A/D line).

Such a TAD having non-linearity becomes a problem for example in sensing equipment, measuring equipment, etc. where precise linearity is required and is difficult to use as an A/D converter in such sensing equipment etc. As one method for solving the problem of the non-linearity of the TAD output characteristic, for example, Japanese Unexamined Patent Publication (Kokai) No. 5-259907 discloses technology for storing correction values corresponding to non-linearity of output data in a correction use ROM and using the correction values to correct the A/D converted output data. By using this, an A/D converted output characteristic changing linearly with respect to changes in input voltage can be obtained.

Summarizing the problem to be solved by the present invention, a TAD output has a characteristic of fluctuating even due to temperature changes. That is, the delay times of the delay units forming the pulse delay circuit change not only due to the voltage input as the power supply voltage, but also the temperature. Therefore, the non-linearity of the A/D converted output characteristic also changes due to the temperature.

To deal with this, for example, it may be considered to separately provide a temperature measurement circuit, store correction values based on temperature in the correction use ROM, and make corrections in accordance with the temperature. With this method, however, it is necessary to prepare correction values for the different temperatures in a presumed temperature range. This would invite an increase in size of the ROM and greater complexity of the circuit configuration and would become a factor behind higher costs.

Further, not only in a TAD, but in a general A/D converter as well, the A/D converted output data generally includes non-linear error. Further, the output value ends up changing due to a change in the ambient temperature, i.e., so-called "temperature drift" occurs. Therefore, even if the method of correction using a correction use ROM is applied for correction of non-linearity of a general A/D converter, the above type of problem will still end up occurring.

SUMMARY OF THE INVENTION

An object of the present invention is to provide a method and apparatus for linear correction of the non-linearity of an A/D converted output characteristic at a low cost without requiring consideration of temperature changes.

To attain the above object, according to a first aspect of the present invention, there is provided a method of correction of A/D converted output data for correcting digital data obtained by A/D conversion of an analog signal, comprising forming at least a first order approximation polynomial curve approximating an input/output characteristic curve of A/D conversion in an input range of the analog signal, setting an ideal input/output characteristic line of A/D conversion, deriving a conversion equation for converting coordinates of a point on the approximation polynomial curve to coordinates of a point on the ideal input/output characteristic line corresponding to the same analog signal value, and using this conversion equation to convert the A/D converted digital data to linearly correct it.

To attain the above object, according to a second aspect of the present invention, there is provided an apparatus for correction of A/D converted output data for correcting digital data obtained by inputting an analog signal to an A/D converter, comprising a reference signal input unit for inputting a plurality of analog signal values as reference signals to the A/D converter in a predetermined input range of the analog signal, an approximation polynomial curve forming unit for obtaining at least a first order approximation polynomial curve for approximating an input/output characteristic curve of the A/D conversion based on reference digital data output from the A/D converter for input of the reference signal, an ideal input/output characteristic line setting unit for setting an ideal input/output characteristic line corresponding to the input/output characteristic curve of the A/D conversion in the predetermined input range of the analog signal, a conversion equation deriving unit for deriving a conversion equation for converting coordinates of a point on the approximation polynomial curve to coordinates of a point on the ideal input/output characteristic line corresponding to the same analog signal value, and a data converting unit for converting digital data output from the A/D converter by the conversion equation.

To attain the above object, according to a third aspect of the present invention, there is provided an A/D conversion system comprising an A/D converting unit for converting an analog signal to digital data, a reference signal input unit for inputting a plurality of analog signal values as reference signals to the A/D converting unit in a predetermined input range of the analog signal, an approximation polynomial curve forming unit for obtaining an approximation polynomial curve for approximating an input/output characteristic curve of the A/D conversion based on reference digital data output from the A/D converter for input of the reference signal, an ideal input/output characteristic line setting unit for setting an ideal input/output characteristic line corresponding to the input/output characteristic curve of the A/D conversion in the predetermined input range of the analog signal, a conversion equation deriving unit for deriving a conversion equation for converting coordinates of a point on the approximation polynomial curve to coordinates of a point on the ideal input/output characteristic line corresponding to the same analog signal value, and a data converting unit for converting digital data output from the A/D converting unit by the conversion equation.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

To better clarify the actions and effects of the present invention, before explaining the embodiments of the invention, the related art will be explained in further detail with reference to the drawings.

Figure 20:
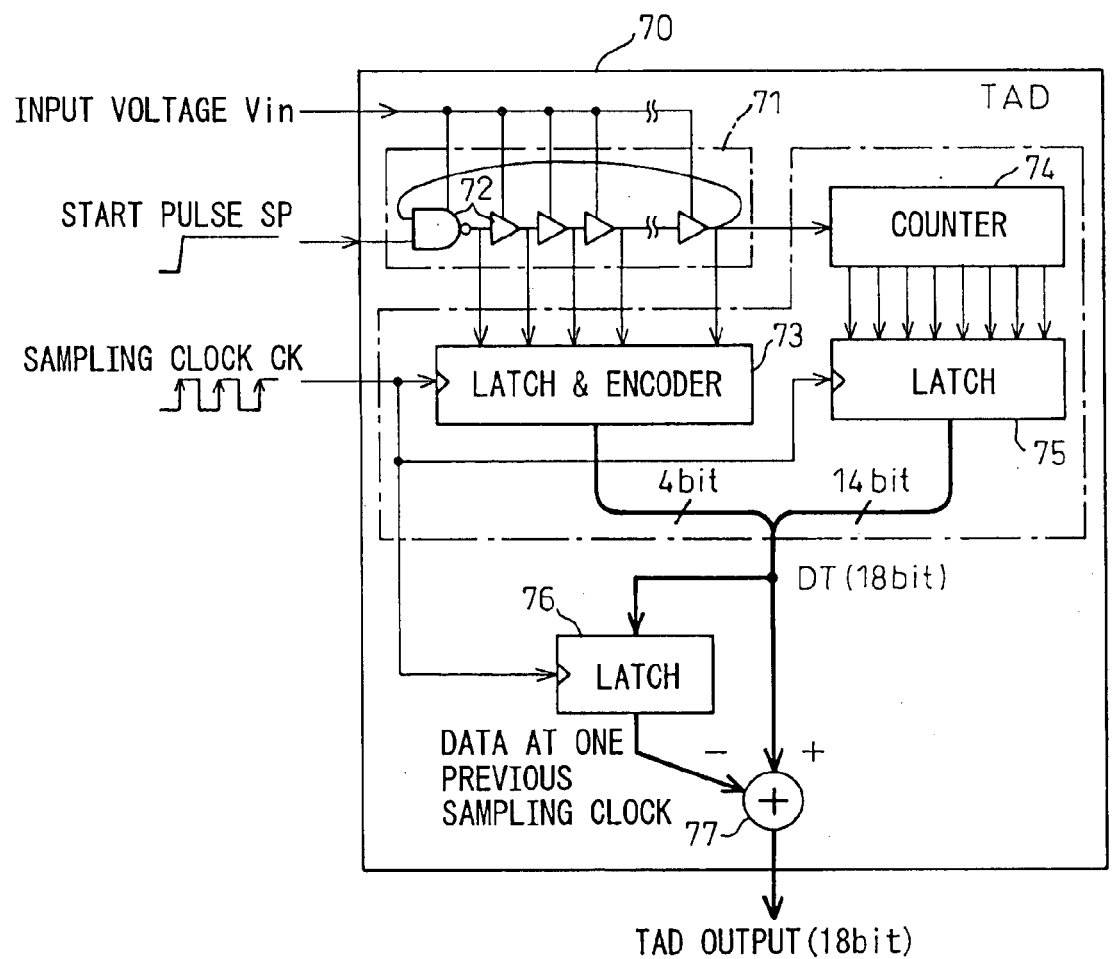
FIG. 20 is an explanatory view of the general configuration of a conventional A/D converter (TAD) using a pulse delay circuit.

The general configuration of an A/D converter 70 of the related art is shown in FIG. 20. The TAD 70 shown in FIG. 20 is provided with a pulse delay circuit 71 for sending around a start pulse SP, a latch and encoder 73 for detecting (latching) an arrival position of the start pulse SP in the pulse delay circuit 71 at a rising (or falling) timing of a sampling clock CK input from the outside and outputting the detection result converted to predetermined bits of digital data expressing what number stage the delay unit 72 through which the start pulse SP passed is from the head, a counter 74 for counting the number of cycles of the start pulse SP in the pulse delay circuit 71, and a latch circuit 75 for latching the count of the counter 74 at the rising (or falling) timing of the sampling clock CK.

The pulse delay circuit 71 is comprised of a plurality of cascade-connected delay units 72 outputting the start pulse SP delayed by exactly predetermined delay times. The initial stage delay unit 72 is comprised by a NAND gate having one input terminal as a startup terminal for start pulse SP input. The other input terminal of the initial stage delay unit 72 is connected with the output terminal of the final stage delay unit 72. Due to this, all of the delay units 72 are connected in a ring. Further, all of the delay units 72 other than the initial NAND gate are comprised of inverters or other gate circuits. Due to this, the pulse delay circuit 71 is comprised as a ring delay line (RDL) able to circulate the start pulse SP.

Each delay unit 72 is supplied with the input voltage Vin for A/D conversion as a drive power supply voltage through a not shown buffer etc. Therefore, the delay time of each delay unit 72 becomes a time corresponding to the voltage level of the input voltage Vin. The number of delay units 72 through which the start pulse SP passes in the pulse delay circuit 71 in one period of the sampling clock CK (hereinafter referred to as the "sampling period") depends on the voltage level of the input voltage Vin.

Therefore, the thus configured TAD 70 gives digital data DT comprised of the digital data output from the latch and encoder 73 as lower bit data (4 bits) expressing the voltage level of the input voltage Vin and of the count output from the latch circuit 75 as upper bit data (14 bits) expressing the voltage level of the input voltage Vin.

This digital data DT is latched by the latch 76 and input to a subtractor 77. The latch 76 latches the digital data DT in accordance with the sampling clock CK and outputs the latched digital data to the subtractor 77 at the next timing. Therefore, the subtractor 77 computes the difference between the current digital data DT and one previous sampling clock CL's worth of digital data and outputs the computation result as the A/D conversion result of the TAD 70.

Figure 21:
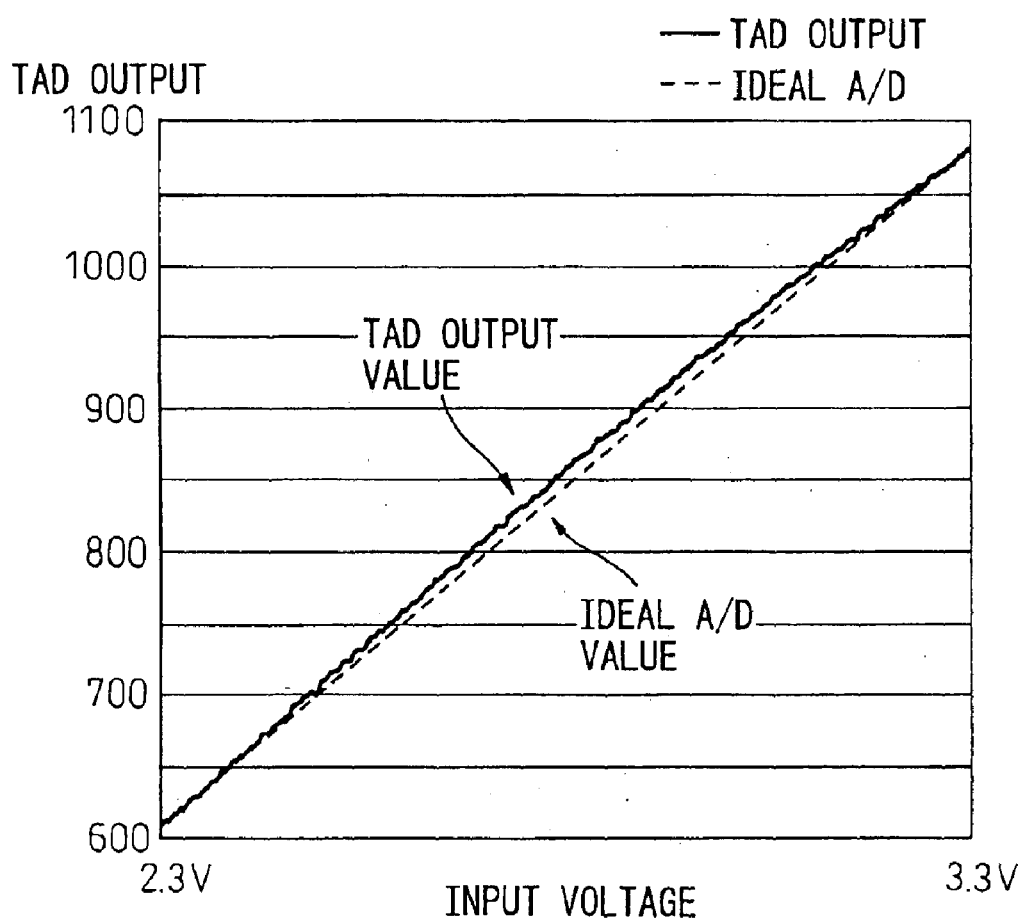
FIG. 21 is a graph of the A/D converted output characteristic of a TAD.

The output characteristic of such a TAD 70 usually has non-linearity as shown for example in FIG. 21. That is, in the example of FIG. 21, it is an output characteristic bulging upward from the straight line of the desired output characteristic (ideal A/D line). Further, FIG. 21 shows an example of the output characteristic when driving the TAD 70 in an environment of a temperature of 25° C. using a sampling clock CK of 6.75 MHz and having an input voltage for A/D conversion of 2.3V to 3.3V.

The A/D converted output does not change linearly with respect to changes in the input signal Vin because the delay times of the NAND gate or inverters comprising the pulse delay circuit 71 do not change proportionally to changes in the power supply voltage. The fact that the characteristic bulges upward as shown in FIG. 21 is clear from the theoretical equation of the TAD output characteristic. Equation (1) shows the theoretical equation of the A/D converted output value of the TAD 70.

$$AD \text{ converted output} = \frac{\beta*(Vin - Vt)^\alpha}{Vin} \quad (1)$$

where, α=1.4 to 1.6, β: constant, Vin: input voltage, Vt: threshold

Such a TAD having non-linearity becomes a problem for example in sensing equipment, measuring equipment, etc. where precise linearity is required and is difficult to use as an A/D converter in such sensing equipment etc.

According to the present invention, it is possible to linearly correct the nonlinear input/output characteristic of A/D conversion. In a first mode of the invention, the analog signal input range is divided into N number of areas, the input/output characteristic curve is approximated by a line connecting the two ends of the input/output characteristic curve in each area (approximation line), a conversion equation is derived for converting any coordinate point on an approximation line to a coordinate point on the ideal input/output characteristic line, that is, the ideal A/D line, for the same analog signal as that coordinate point, and that derived conversion equation is used to convert digital data output from the A/D converter.

Figure 15:
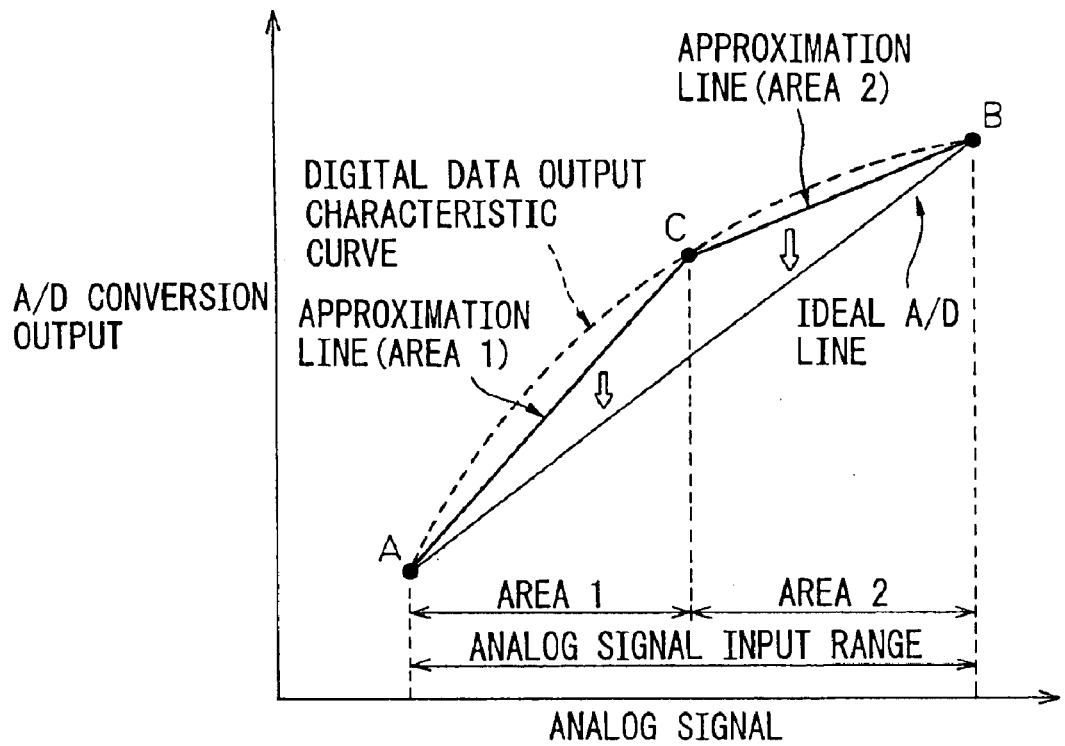
FIG. 15 is an explanatory view of an example of linear approximation of an input/output characteristic curve for each area.

That is, as illustrated for example as shown in FIG. 15, the analog signal input range is equally divided into N number (here, two) areas (areas 1 and 2), and the points at the two ends of each area on the input/output characteristic curve are connected to obtain an approximation line. In the example of FIG. 15, in the area 1, the curve is approximated by the approximation line connecting the points A and C, while in the area 2, the curve is approximated by the approximation line connecting the points C and B. The points A, B, and C are obtained by actual A/D conversion of the corresponding analog signal values by an A/D converter. That is, they are actual data corresponding to the ambient environment (temperature etc.) at that time.

Further, a conversion equation is derived for converting any coordinate point on an approximation line to a coordinate point on the ideal input/output characteristic line, that is, the ideal A/D line, for the analog signal value of that coordinate point. Further, the "input/output characteristic curve" referred to here is the set of the coordinate points of the actual digital data corresponding to the analog signal.

Various specific methods may be considered for deriving the conversion equation. For example, if the coordinate data at the two ends of the input/output characteristic curves of the different areas (in FIG. 15, the A/D converted output of the points A, AB, and C) is actually obtained, it is possible to geometrically obtain the conversion equation based on the coordinate point data and the data of the coordinate points on the ideal A/D line corresponding to the analog signal of the coordinate points. Alternatively, it is possible to express an approximation line and ideal A/D line by separate functions and obtain the conversion equation from the relation of the two functions.

Which method to use for obtaining the conversion equation can be suitably determined considering the specific configuration for realizing this method or the specific configuration (software or hardware) for actual conversion by the obtained conversion equation. Therefore, according to the first aspect of the present invention, since the conversion equation is derived based on the actual A/D converted output data and this conversion equation is used for conversion of the digital data (linear correction), it is possible to precisely linearly correct the characteristic by a suitable conversion equation in accordance with the temperature at that time without regard as to changes in the ambient temperature. Further, since this is linear correction by simple computation using a conversion equation, it is possible to realize linear correction at a lower cost compared with the method of storing correction values in a correction use ROM as in the related art.

Further, in FIG. 15, the explanation was given with reference to an example of equal division into two areas, but the number divided into may be freely determined. The larger the number divided into, the smaller the non-linear error (error between input/output characteristic and ideal A/D line after linear correction). However, the larger the number divided into, the more complicated the specific configuration for realizing linear correction, so the number divided into should be determined considering the balance between the complexity of the configuration and the correction precision.

Further, the areas divided into need not be equal. Further, setting the ideal A/D line to a line connecting the two ends of the input/output characteristic curve such as shown in FIG. 15 is merely one example. It is also possible to make it a line connecting any two points other than the two ends. Alternatively, it may be made a line not intersecting at all with the input/output characteristic curve in the analog signal input range or a line giving a digital data output characteristic directly proportional to the analog signal at least in the analog signal input range.

However, the non-linearity of the A/D converted output characteristic of the TAD 70 explained in FIG. 20 for example, as explained in FIG. 21, is generally an upwardly bulging characteristic curve. Therefore, if the line connecting the two ends of the characteristic curve is made the approximation line for each area for a curve having an upwardly bulging characteristic, the non-linear error (error between the data after conversion (linear correction) by the above conversion equation and the data on the ideal A/D line) will lean either to the positive or negative side (in other words, the absolute value of the error will become larger).

That is, as will be clear from the example of FIG. 15 as well, in the present example, the approximation curve will become smaller than the input/output characteristic curve in each area (two areas), so the non-linear error will lean to the positive (or negative) side. This leaning of the non-linear error to either the positive or negative side is not too preferable as a characteristic of an A/D converter. Preferably, the characteristic becomes one where the non-linear error becomes the same level to the positive and negative side, that is, the absolute value becomes the same level, expressed as "±00%".

Therefore, the approximation line for example may be made as follows. That is, each of the approximation lines at the area including the minimum value and the area including the maximum value in the analog signal input range may be made a line connecting a coordinate point other than the two ends of the input/output characteristic curve in that area and the boundary point with another adjoining area.

Figure 16:
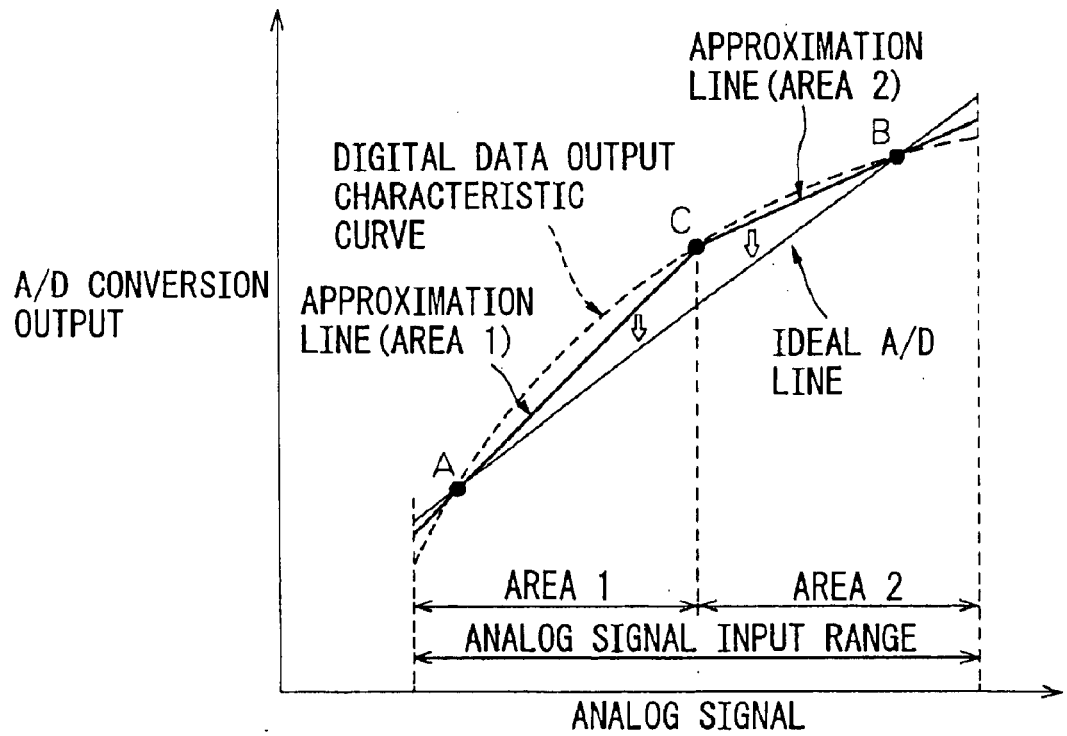
FIG. 16 is an explanatory view of an example of linear approximation of an input/output characteristic curve for each area.

For example, as illustrated in FIG. 16, in the area 1 including the minimum value of the analog signal, it is made the approximation line connecting a coordinate point A other than the coordinate point corresponding to the minimum value and the coordinate point C of the area boundary, while in the area 2 including the maximum value of the analog signal, it is made the approximation line connecting a coordinate point B other than the coordinate point corresponding to the maximum value and the coordinate point C of the area boundary, By doing this, for example, in the area 1, the input/output characteristic curve becomes larger than the approximation line in the range where the analog signal is larger than the coordinate point A, while the approximation line becomes larger than the input/output characteristic curve in the range where it is smaller than the coordinate point A. As a result, the positive/negative imbalance in the non-linear error after linear correction is reduced. Further, even in the case of division into more than two areas, it is sufficient to obtain similar approximation lines for the areas including the maximum value and minimum value of the analog signal.

Therefore, correction of the positive/negative imbalance of the non-linear error becomes possible and in turn reduction of the absolute value of the non-linear error becomes possible. Here, if the lengths of the N number of divided areas are different, the conversion equation from the approximation line to the ideal A/D line will end up becoming complicated. Therefore, for example, the time required for linear correction will increase or the circuit configuration will end up becoming complicated if trying to realize computation by the conversion equation by a hard logic circuit.

Therefore, the range should be divided so that the lengths of the areas of the analog signals become the same. That is, when dividing the analog signal input range into N number of areas, it should be divided so that the lengths of the areas of the analog signal become the same. By doing this, it is possible to configure the conversion equation by a relative simple formula and keep down an increase of the time for linear correction or complication of the circuit configuration.

However, the greater the number N divided into, the better the correction precision (the lower the non-linear error), but the more complicated the specific configuration (circuit configuration etc.) for realizing the linear correction. Further, at the boundary parts of the areas, the differential coefficient of the characteristic curve becomes discontinuous, so if using digital data linearly corrected by this method for control etc., the control operation is liable to become unstable at the discontinuous points.

In a second mode of the present invention, the input/output characteristic curve is approximated by a curve expressed by an (M−1) or less order (but second or higher order) polynomial (approximation curve) based on any M number of coordinate points on the input/output characteristic curve in a predetermined analog signal input range, a line having a characteristic directly proportional to the analog signal is set as the ideal A/D line, a conversion equation is derived for converting a point on the approximation line to a coordinate point on the ideal A/D line for the same analog signal value as that coordinate point, and the derived conversion equation is used to convert the digital data output from the A/D converter.

That is, in the first mode, the input/output characteristic line is linearly approximated for each area and a conversion equation is derived for converting the approximation line to the ideal A/D line, while in the second mode, first the input/output characteristic curve as a whole is approximated by an approximation curve expressed by a second or higher order polynomial and then a conversion equation is derived for converting any coordinate point on the approximation curve to a coordinate point on the ideal A/D line.

Figure 17:
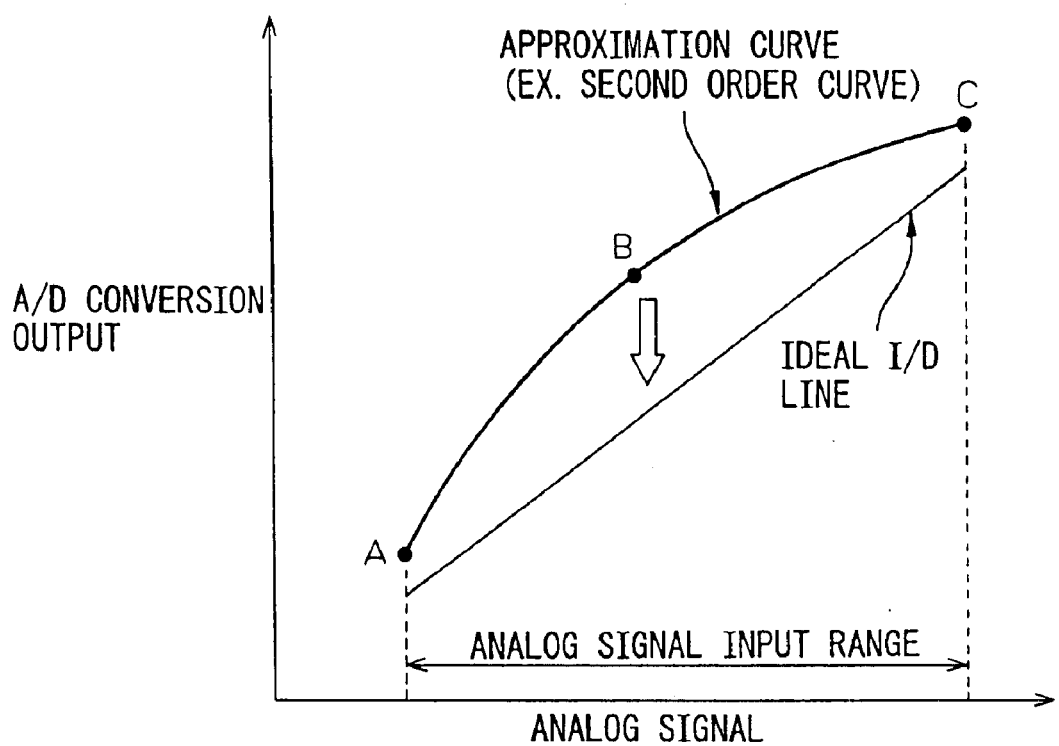
FIG. 17 is an explanatory view of an example of approximation of an input/output characteristic curve by a second order curve.

FIG. 17 schematically shows using a second order curve passing through three coordinate points A, B, and C as the approximation curve and converting any coordinate point on the approximation curve to a coordinate point on the ideal A/D line. In the case of the example of FIG. 17, if actually A/D converting the analog signal value for the coordinate points A, B, and C to find the digital data, it is possible to obtain a second order polynomial expressing a second order curve (approximation curve) passing through the coordinate points A, B, and C. Further, any coordinate point on the approximation curve expressed by this second order polynomial is converted by the conversion equation to a coordinate point on the ideal A/D line for the same analog signal value as that coordinate point.

Figure 18:
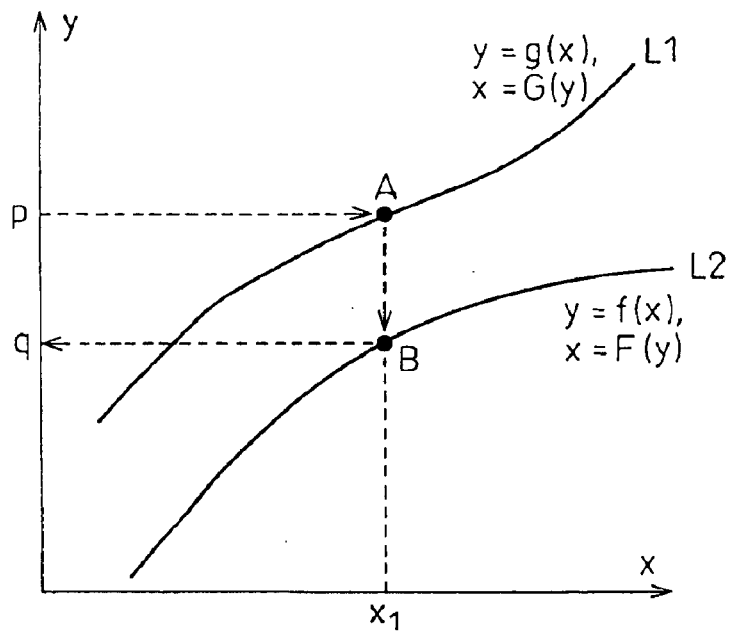
FIG. 18 is an explanatory view of the method of deriving a conversion equation for converting any coordinate point on a curve L1 to a coordinate point on another curve L2.

As a method for obtaining an (M−1) or lower order polynomial from M number of coordinate points, there are for example the known least square method, Lagrange interpolation formula, etc. Further, there are various specific methods for deriving the conversion equation. For example, the following method may be considered. As illustrated in FIG. 18, conversion from any point $A(x_1,p)$ on any curve L1: $y=g(x)$ (inverse function: $x=G(y)$) on an x-y coordinate system to any point $B(x_1,q)$ on any other curve L2: $y=f(x)$ (inverse function: $x=F(y)$) can be obtained by solving the following equation (2) for q:

$$F(q)=G(p) \qquad (2)$$

That is, if the function of the approximation curve and the function of the ideal A/D line are known, it is possible to apply the above equation (2) to obtain the conversion equation. Further, the method of deriving the conversion equation illustrated by FIG. 18 and the above equation (2) is only an example. The invention is not limited to this.

In this way, since M number of analog signal values are actually A/D converted and the approximation curve and conversion equation are derived based on the results, it becomes possible to precisely linearly correct a characteristic by a suitable conversion equation in accordance with the temperature at that time without regard as to temperature changes or other changes in the ambient environment. Further, since the linear correction is based on simple computation using a conversion equation, linear correction can be realized at a lower cost compared with the method of storing correction values in a correction use ROM like in the related art.

Further, unlike when linearly approximating an input/output characteristic curve like in the first mode, since the input/output characteristic curve is expressed by an (M−1) or lower and second order or higher polynomial in accordance with the M number of coordinate points obtained by actual A/D conversion and the conversion equation is derived based on this, it becomes possible to obtain a linear corrected result with no discontinuity of differential coefficients with a precision relatively higher than the method based on an approximation line.

Further, the method of deriving a conversion equation illustrated in FIG. 18 and the above equation (2) (derivation of conversion equation by function) can also be applied when deriving a conversion equation in the above first mode. That is, for example, in FIG. 15, it is also possible to actually measure the digital data (A/D converted output value) for the coordinate points A, B, and C, find the first order function of the approximation line for each area (for example, find F(x)), express this by a first order function for the ideal A/D line as well (for example, G(x)), and find the conversion equation from these two functions.

Therefore, the polynomial expressing the approximation line may be any order of two or more, but the actual input/output characteristic curve can be expressed by a substantially second order curve. The error between the approximated second order curve and actual input/output characteristic curve is of a level not posing a problem. Therefore, the polynomial expressing the approximation curve can be made a second order equation (that is, a second order curve).

For derivation of the second order equation, it is possible to actually find the digital data for any three or more analog signals and derive it based on the data by a known method such as the Lagrange interpolation formula or the least square method. If for example applying the method illustrated in FIG. 18 to conversion from a second order equation (second order curve) to a line, it is possible to obtain a conversion equation as shown below.

Figure 19:
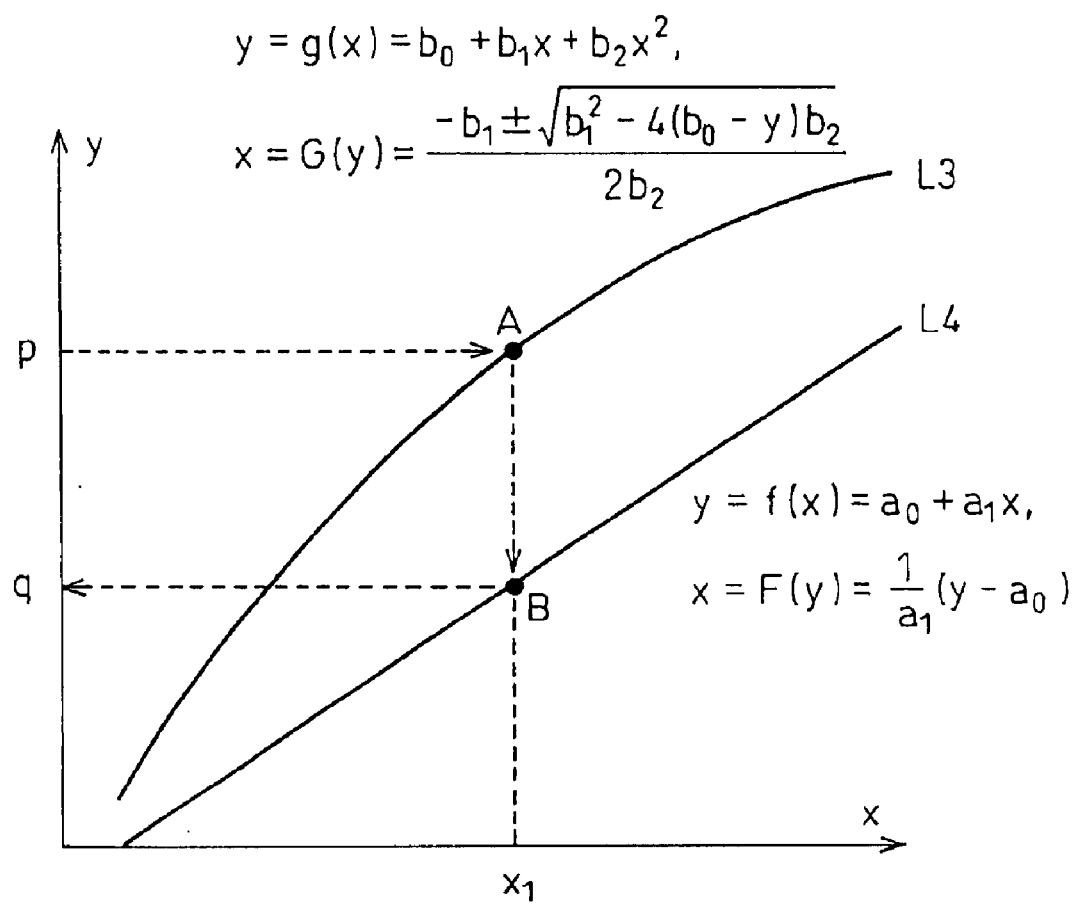
FIG. 19 is an explanatory view of the method of deriving a conversion equation for converting any coordinate point on a second order curve L3 to a coordinate point on a line L4.

That is, as illustrated in FIG. 19, if making any second order curve (that is, approximation curve) L3 $y=b_0+b_1x+b_2x^2$ and making any other line L4 (that is, ideal A/D line) $y=a_0+a_1x$, the inverse functions can be expressed by the following formulas (3) and (4):

$$L3: x = G(y) = \frac{-b_1 \pm \sqrt{b_1^2 - 4(b_0 - y)b_2}}{2b_2} \quad (3)$$

$$L4: x = F(y) = \frac{1}{a_1}(y - a_0) \quad (4)$$

Further, the sign "−" is selected when the curve bulges upward (corresponding to TAD input/output characteristic curve), while the sign "+" is selected when the curve bulges downward. Therefore, conversion from any point $A(x_1,p)$ on the approximation curve L3 to any point $B(x_1,q)$ on the ideal A/D line L4 may be obtained by the following equation (5) by entering the above equations (3) and (4) into equation (2):

$$q = \frac{a_1}{2b_2}\left(-b_1 \pm \sqrt{b_1^2 - 4(b_0 - p)b_2}\right) + a_0) \quad (5)$$

If the input/output characteristic curve is approximated by the polynomial expressed by a second order equation in this way, it becomes possible to simplify the circuit configuration etc. for realizing linear correction while maintaining the precision of linear correction. Further, in this case, the number M of coordinate points for deriving the second order equation should be at least three. It is possible to obtain a second order equation from these three or more coordinate points as explained above by for example the least square method or the Lagrange interpolation formula, but to further simplify the specific configuration for derivation, the coordinate points should be minimized (in this case, M=3).

However, if the number of coordinate points is small, for example if the error of the digital data at any coordinate point is large, the error between the approximation curve obtained based on this and the actual input/output characteristic curve would end up becoming larger. Therefore, to approximate an approximation curve closer to the actual input/output characteristic curve, the number M of coordinate points should be made large. That is, the number M of coordinate points should be suitably determined in consideration of the specific configuration for realizing the curve approximation (derive the polynomial), the approximation precision, etc.

However, as shown in the above example (FIG. 19), if the approximation curve is expressed by the second order function of x ($y=b_0+b_1x+b_2x^2$), a square root extraction operation is performed in the conversion equation as shown in equation (5). Therefore, compared with realization of a conversion equation by only the simple fundamental four arithmetic operations, the specific circuit configuration etc. for realizing the linear correction by the conversion equation ends up becoming complicated.

Therefore, the above second order equation should be expressed by the second order function $x=c_0+c_1y+c_2y^2$ where the analog signal is x, the digital data is y and $c_0$, $c_1$, and $c_2$ are constants. By expressing the second order equation in this way, for example in the example of FIG. 19, the conversion equation of the following equation (6) is obtained from the second order function for the curve L3 and the equation (4) for the line L4:

$$q=a_1(c_0+c_1p+c_2p^2)+a_0 \quad (6)$$

As shown in equation (6), by expressing the approximation curve by the second order function of y, it is possible to obtain a conversion equation able to be realized by only the fundamental four arithmetic operations, so the specific circuit configuration etc. for realizing linear interpolation can be realized more simply.

Usually, the possibility is high that a center value in the analog signal input range will be input more frequently, so generally an A/D converter is configured (designed) so that the digital data at that center value is obtained with a greater precision.

Further, preferably, the precision becomes high not only at the center value, but at the entire analog signal input range, but realistically with an analog signal with a large difference from the center value, the A/D conversion precision becomes worse by that extent. Therefore, if trying to obtain a polynomial based on digital data with such poor precision (coordinate points), the error between the obtained polynomial (approximation curve) and actual input/output characteristic curve is liable to end up becoming larger.

Therefore, the M number of coordinate points should be made any coordinate points except the two ends of the analog signal input range. If selecting the M number of coordinate points in this way, it is possible to reduce the error between the actual input/output characteristic curve and the approximation curve compared with the case of selecting the coordinate points of the two ends of the analog signal input range (for example, the points A and C of FIG. 17).

Here, the TAD 70 explained in FIG. 20, unlike the general A/D converter, is characterized in principle of A/D conversion that even if the same analog signal is input, the TAD output data (digital data) will differ depending on the difference in the sampling clock CK. That is, as explained above, the TAD 70 is configured so that the difference between the current digital data and the digital data of one clock before becomes the TAD output (A/D conversion result).

Accordingly, the higher the sampling clock CK, the shorter the sampling interval and the smaller the TAD output. Table 1 shows an example of the TAD output for analog values of 2.3V (minimum value) and 3.3V (maximum value) when the sampling clock CK is 1 to 15 MHz.

TABLE 1

| Sampling clock (MHz) | TAD output | |
| --- | --- | --- |
| | 2.3 V input | 3.3 V input |
| 15 | 67 | 117 |
| 10 | 100 | 175 |
| 9 | 111 | 194 |
| 8 | 125 | 219 |
| 7 | 143 | 250 |
| 6 | 167 | 292 |
| 5 | 200 | 350 |
| 4 | 250 | 438 |
| 3 | 333 | 583 |
| 2 | 500 | 875 |
| 1 | 1000 | 1750 |

Therefore, when desiring to use an A/D converter for 8-bit output, if the difference between the digital data for the minimum value of the analog signal in the analog signal input range and the digital data for the maximum value of the analog signal exceeds 255 (that is, $2^8-1$), the converter could not be used as it is as an 8-bit A/D converter. Specifically, when for example making the sampling clock CK 1 MHz, the difference between the maximum value and the minimum value becomes 1750−1000=750 or ends up exceeding 8 bits.

On the other hand, as an A/D converter, the above illustrated 8-bit output or 10-bit output ones are generally mainly used. Apparatuses for control and processing using the digital data from such an A/D converter also frequently are matched in number of A/D converted output bits.

Therefore, the ideal A/D line should be set so that the difference between the digital data for the minimum value of the analog signal in the analog signal input range and the digital data for the maximum value of the analog signal becomes a preset predetermined bit length.

That is, if for example making the predetermined number of bits 8 bits (that is, desiring use as an 8-bit A/D converter), the ideal A/D line is set so that the difference between the minimum value and maximum value becomes 8 bits (255). By doing this, it is possible to get the final digital data output converted to a desired number of bits even for an A/D converter where the number of the output bits changes in accordance with the sampling clock as in a TAD, so there is the effect that the range of application of the A/D converter is expanded.

An apparatus for correction of A/D converted data having an A/D converter according to a third mode of the present invention has a reference signal input unit, an approximation polynomial curve forming unit, an ideal input/output characteristic line setting unit, a conversion equation deriving unit, and a data converting unit. The reference signal input unit divides a predetermined input range of the analog signal into a plurality of areas and inputs the minimum value and the maximum value of the analog signal in that predetermined range and the values of the boundary parts of the areas into the A/D converter as reference signals. The approximation polynomial curve forming unit obtains an approximation line approximating the input/output characteristic curve of A/D conversion for each area based on the reference digital data obtained for input of the reference signals, derives a conversion equation for converting coordinates of a point on the approximation line to coordinates of a point on the ideal input/output characteristic line corresponding to that analog signal value, and corrects output data by conversion by that conversion equation. Due to this, linear correction of digital data from an A/D converter is realized.

According to the apparatus for correction of A/D converted output data configured in this way, similar effects are obtained as in the first mode. The correction apparatus of the present invention may also be configured as an A/D converter with a linear correction function overall by incorporation in for example an A/D converter. Further, for example, it may be configured as a separate unit from the A/D converter and fetch output data from an A/D converter for linear correction. It is not particularly limited in configuration so long as linear correction of A/D converted output data (digital data) is achieved.

Further, the reference signal input unit may also use as the reference signal value instead of the minimum value of the analog signal an analog signal value other than the minimum value of the analog signal smaller than all other reference signals and use as the reference signal value instead of the maximum value of the analog signal an analog signal other than the maximum value of the analog signal larger than all other reference signals.

If configuring the correction apparatus in this way, the non-linear error will not lean to the positive or negative side. Further, the number N of divided areas of the analog signal input range may be fixed to a predetermined number, but the apparatus may also be configured to enable the number N divided into (number of areas) to be freely set by a division number setting means. By doing this, the effect is obtained that the precision of the linear correction can be changed.

In the apparatus for correction of A/D converted output data of a fourth mode of the present invention, a reference signal input unit inputs M number of analog signal values of a predetermined input range of the analog signal as reference signals to an A/D converter, while an approximation polynomial curve forming unit obtains an approximation curve expressed by a second or higher order and an (M−1) or lower order polynomial approximating the input/output characteristic curve of the A/D conversion based on the reference digital data output from the A/D converter, derives a conversion equation for converting coordinates of a point on the approximation curve to coordinates of a point of the ideal input/output characteristic line corresponding to the same analog signal value, and corrects the output data converted by the conversion equation. Due to this, linear correction of digital data from the A/D converter is realized.

According to the correction apparatus configured in this way, effects similar to those of the second mode are obtained. The input/output characteristic line may be set in a state with predetermined functions set in advance. Further, for example, it may be sequentially set each time a polynomial is derived by the polynomial deriving means. The set state and method are not particularly limited.

Further, the reference signal input means@ may input three analog signal values to the A/D converter as reference signals, while the polynomial deriving means may derive a second order polynomial as the polynomial. By doing this, good precision line correction is possible. Further, since the minimum necessary three analog signal values are used for obtaining the second order polynomial (that is, a second order polynomial is obtained from three coordinate points), it is possible to simplify the specific configuration for deriving a second order polynomial and in turn possible to simplify the configuration of the A/D converted output data correction apparatus as a whole.

Further, the reference signal input unit may input analog signal values other than the minimum value and maximum value in the analog signal input range as reference signals to the A/D converter. By configuring the reference signal input unit in this way, it is possible to reduce the error between the actual input/output characteristic curve and approximation curve compared with the case of selecting the minimum value and maximum value in the analog signal input range.

Here, the units forming the A/D converted output data correction apparatus of this mode of the present invention may be formed in the same semiconductor integrated circuit. By doing this, the A/D converted output data correction apparatus can be reduced in size compared with the case of forming the units at separate parts (packages) and the degree of freedom of installation of the apparatus can be increased.

Further, the A/D converter also can be made smaller in size and increased in freedom of installation if configured in the same semiconductor integrated circuit as the correction apparatus. Further, the correction apparatus can be applied to various A/D converters having nonlinear output characteristics, but the TAD 70 explained in FIG. 20 tends to have a larger non-linearity than a general A/D converter. Further, as explained above, the digital data output value also differs along with differences in the sampling clock.

That is, in Table 1, the difference of the TAD output at the sampling clock CK of 15 MHz becomes 117−67=50, while the difference of the TAD output at the sampling clock CK of 1 MHz becomes 1750−1000=750. The amounts of non-linearity of these two examples of sampling clocks differ, therefore the amounts of correction for linear correction also differ. Accordingly, if trying to perform linear correction using a correction use ROM such as in the past, it would be necessary to prepare not only correction values for different temperatures, but also correction values for different sampling clocks.

Therefore, the A/D converter provided with the correction apparatus of the first mode is provided with a pulse delay circuit comprised of a plurality of serial connected delay units for outputting a pulse signal delayed by a delay time in accordance with the voltage level of the analog signal and transferring a pulse signal while successively delaying it by the delay times of the delay units and a detecting means for detecting the number of delay units through which the pulse signal passes in a preset sampling period. The detection result of the detecting means is output as digital data of the result of A/D conversion for the analog signal. The data converting unit may convert the digital data from the A/D converter in accordance with a conversion equation.

The A/D conversion circuit of the above configuration receives as input the analog signal for A/D conversion as power supply voltage of the delay units forming the pulse delay circuit. The delay time of the pulse signal at each delay unit changes in accordance with the voltage level of the input analog signal. Therefore, when connecting a plurality of delay units serially and transferring a pulse signal in a predetermined sampling period, the number of delay units through which the pulse signal passes will depend on the voltage level of the analog signal. Accordingly, if detecting the number of delay units passed through in this predetermined sampling period, the detection result can be taken out as the A/D conversion result.

The pulse delay circuit may be simply configured by a plurality of serially connected delay units or may be configured by them connected in a ring as with the pulse delay circuit 71 shown in FIG. 20 (still a serial connection). Various configurations are possible for enabling successive transfer of the pulse signal. The output of the digital data may also be the result of detection by the detecting means output as it is or digital data processed in some way.

That is, the specific configurations of the above means are not particularly limited so long as the number of delay units passed in a predetermined sampling period can be detected and digital data corresponding to the result of detection is output. By doing this, the non-linearity of digital data of an A/D converter of the above configuration can be linearly corrected with a good precision not by a complicated configuration using a correction use ROM as in the past, but by a relatively simple configuration.

Next, preferred embodiments of the present invention will be explained with reference to the attached drawings.

First Embodiment

Figure 1:
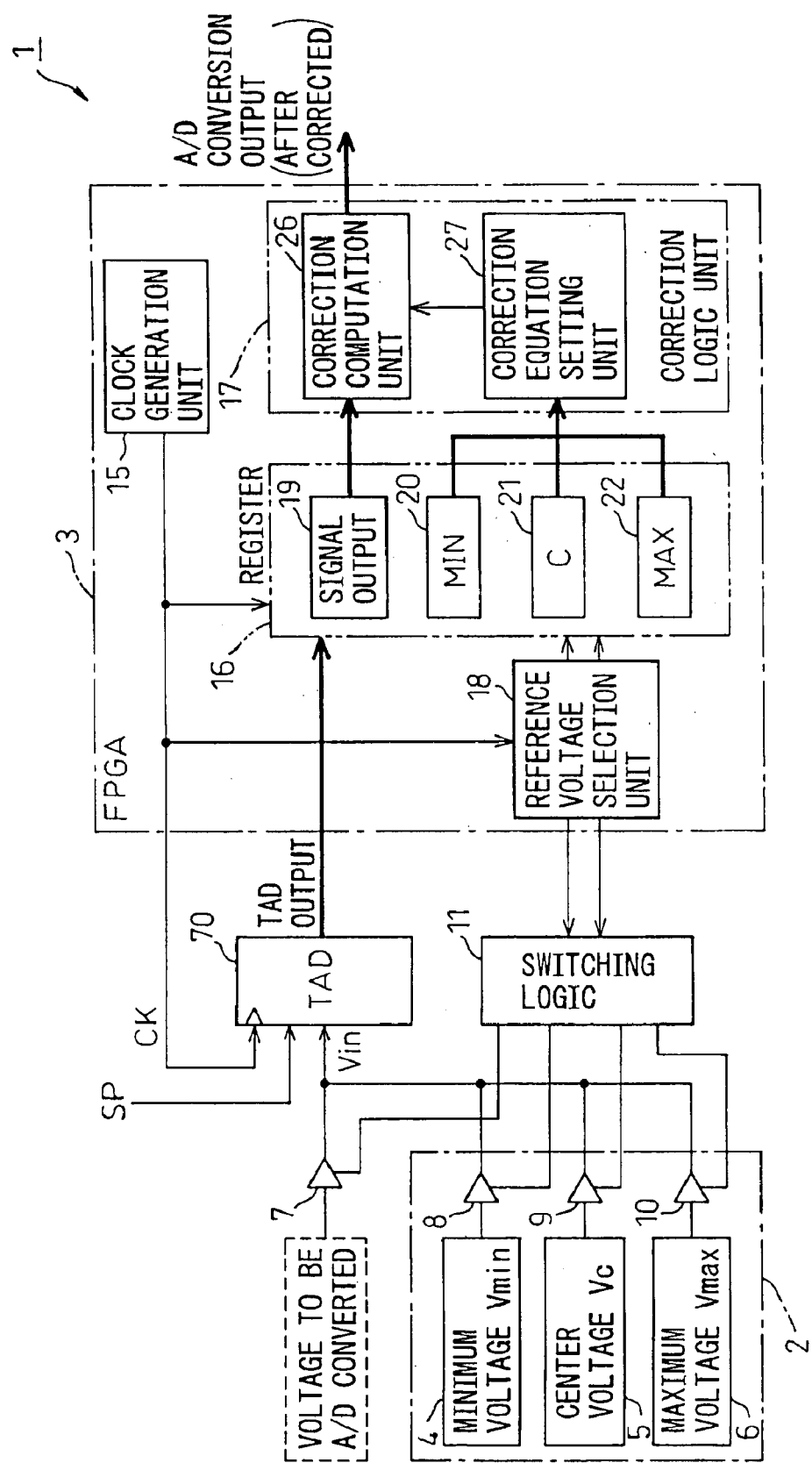
FIG. 1 is a block diagram of the general configuration of an A/D conversion system with a correction function according to a first embodiment of the present invention.

FIG. 1 is a block diagram of the general configuration of an A/D conversion system with a correction function according to a first embodiment of the present invention. As shown in FIG. 1, the A/D conversion system 1 with a correction function according to the present embodiment is comprised of an A/D converter (TAD) 70, a reference voltage input unit 2, a switching logic 11, and a correction unit 3 and linearly corrects and outputs the digital data of the result of A/D conversion for the analog signal Vin input to the TAD 70.

The TAD 70 is completely the same as the TAD 70 explained in FIG. 20. Details were already explained, so here the detailed explanation of the TAD 70 will be omitted. This TAD 70 receives as input a sampling clock (clock pulse) CK of a predetermined period (sampling period) generated by a clock generation unit 15 in the correction unit 3. Further, it receives as input a start pulse SP (pulse signal) from a not shown outside control circuit (CPU etc.) The operation of the TAD 70 is started by this start pulse.

The reference voltage input unit 2 successively inputs to the TAD 70 reference voltages for obtaining the data required for setting the linear correction equation at the correction equation setting unit 27. In the present embodiment, as the reference voltages, the minimum voltage Vmin from a minimum voltage generation unit 4, a center voltage Vc from a center voltage generation unit 5, and a maximum voltage Vmax from a maximum voltage generation unit 6 are input through three-state analog switches 8, 9, and 10 to the TAD 70. Further, input voltages for actual A/D conversion other than these reference voltages (for example, output signals from various sensors etc.) are also input to the TAD 70 through a three-state analog switch 7.

In the TAD 70 of this embodiment, the input voltage range (corresponding to analog signal input range of the present invention) is set to the minimum voltage Vmin to the maximum voltage Vmax. An input voltage in this range is output converted to digital data. Further, the center voltage Vc is an intermediate value between the minimum voltage Vmin and the maximum voltage Vmax. These three voltages (corresponding to reference signals of the present invention) are successively input to the TAD 70 and A/D converted. The linear correction equation is set as explained later based on the result of A/D conversion.

Further, the voltage generation units 4, 5, and 6 can be realized by any configuration able to generate the desired voltages (Vmin, Vc, Vmax). For example, it is possible to obtain these different voltages by configuring a voltage division circuit for dividing a certain set voltage value by a plurality of resistors. In the following explanation, the digital data from the TAD 70 will be referred to as the "TAD output". Among this, in particular, the TAD output for the minimum voltage Vmin, center voltage Vc, and maximum voltage Vmax will be referred to as the "reference TAD output" and the TAD output for the actual voltage for A/D conversion will be referred to as the "actual TAD output".

The switching logic 11 outputs a signal for activating one of the three-state analog switches 7 to 10 and deactivating all others in accordance with an instruction from the reference voltage selection unit 18 in the correction unit 3. In the present embodiment, before starting the A/D conversion, only one of the three-state analog switches 8, 9, and 10 corresponding to the minimum voltage Vmin, center voltage Vc, and maximum voltage Vmax is successively activated to successively input these voltages to the TAD 70 and obtain the corresponding reference TAD outputs.

After this, the linear correction equation is set in the correction equation setting unit 27 and preparations made for linear correction of the actual TAD output from the TAD 70. Then, only the three-state analog switch 7 corresponding to the actual voltage for A/D conversion is activated. This state is continued for a predetermined period until resetting the linear correction equation.

The correction unit 3 sets the linear correction equation and linearly corrects the actual TAD output by the linear correction equation. In the present embodiment, it is confirmed by a single field programmable gate array (FPGA). The correction unit 3 is provided with mainly a clock generation unit 15 for generating and outputting a sampling clock CK, a register 16 for temporarily storing TAD output, a correction logic unit 17 for setting the linear correction equation based on the stored content of the register 16 and linearly correcting the actual TAD output by the linear correction equation, and a reference voltage selection unit 18 for outputting to the switching logic 11 an instruction (signal) for activating only one of the three-state analog switches 7 to 10.

The reference voltage selection unit 18 for example first outputs an instruction activating only the three-state analog switch 8 corresponding to the minimum voltage Vmin. When confirming that the TAD output MIN corresponding to this Vmin has been input and is stored in a minimum data storage unit 20 in the register 16, it then outputs an instruction activating only the three-state analog switch 9 corresponding to the center voltage Vc. Further, when confirming that the TAD output C corresponding to the center voltage Vc has been stored in a center data storage unit 21 in the register 16, it then outputs an instruction for activating only the three-state analog switch 10 corresponding to the maximum voltage Vmax. Due to this, the TAD output MAX corresponding to the maximum voltage Vmax is stored in a maximum data storage unit 22 in the register 16.

That is, by the reference voltage selection unit 18 successively outputting instructions for switching the three-state analog switches 8 to 10, the TAD outputs corresponding to the voltages Vmin, Vc, and Vmax are stored in the minimum data storage unit 20, the center data storage unit 21, and the maximum data storage unit 22.

The correction logic unit 17 is provided with a correction equation setting unit 27 where the linear correction equation is set and a correction operation unit 26 for converting the actual TAD output (correction operation) in accordance with the linear correction equation. The correction equation setting unit 27 sets the linear correction equation based on the MIN, C, and MAX stored in the storage units 20 to 22 in the register 16. The setting of the linear correction equation will be explained based on FIG. 2.

Figure 2:
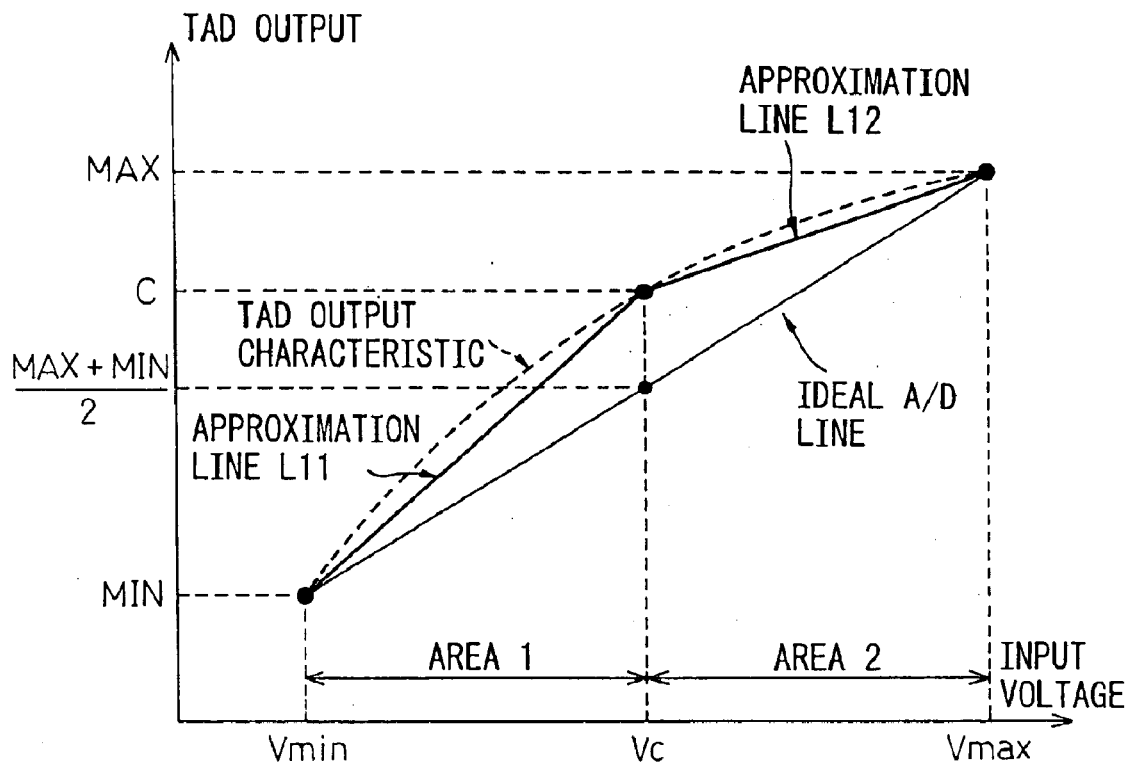
FIG. 2 is a graph of the TAD output characteristic in the first embodiment.

FIG. 2 is a graph of the TAD output characteristics of the present embodiment. The abscissa shows the input voltage of the TAD 70, while the ordinate shows the TAD output. The TAD output characteristic curve showing the relationship between the input voltage and the actual TAD output (input/output characteristic curve of the present invention) is shown by the dotted line. In this way, the TAD output characteristic curve is non-linear. If this were used for various control as the result of A/D conversion as it were, various effects due to the non-linear error would be liable to occur.

Therefore, in the present invention, the input voltage range from the minimum voltage Vmin to the maximum voltage Vmax is equally divided into two areas (area 1 and area 2). The input voltage serving as the boundary of the areas is the center voltage Vc. Further, in each area, the TAD output characteristic curve is approximated by a line connecting the two ends of the characteristic curve at that area (approximation line).

That is, in the area 1, the curve is approximated by the approximation line L11 connecting the coordinate point showing the TAD output for the minimum voltage Vmin and the coordinate point showing the TAD output for the center voltage Vc, while in the area 2, the curve is approximated by the approximation line L12 connecting the coordinate point showing the TAD output for the center voltage Vc and the coordinate point showing the TAD output for the maximum voltage Vmax. On the other hand, a line having a TAD output characteristic directly proportional to the input voltage is set as the ideal A/D line. In the present embodiment, the line connecting the coordinate points showing the TAD outputs for the minimum voltage Vmin and the maximum voltage Vmax is used as the ideal A/D line.

Further, a conversion equation (that is, linear correction equation) for converting any coordinate point on the approximation lines L11 and L12 to a coordinate point on the ideal A/D line at the same input voltage value as that coordinate point is derived for each area 1 and 2. The linear correction equation is derived (set) by the correction equation setting unit 27 in the correction logic 17.

Figure 3:
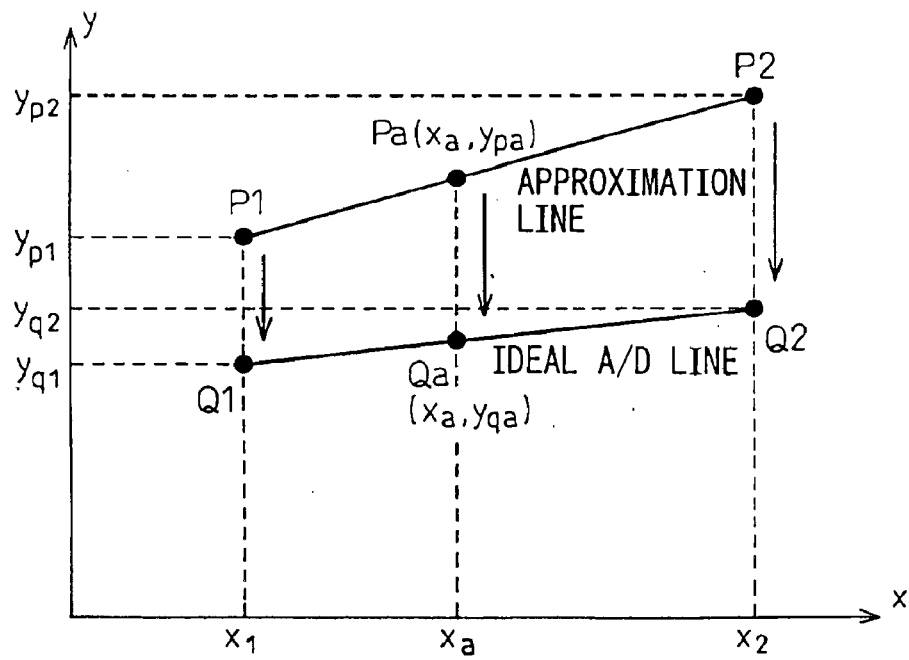
FIG. 3 is an explanatory view of the principle of conversion from an approximation line to an ideal A/D line.

Here, the principle of conversion of coordinate points from the approximation lines L11 and L12 to the ideal A/D line in the embodiments will be explained based on FIG. 3. As shown in FIG. 3, the line connecting the point $P1(x_1, y_{p1})$ and the point $P2(x_2, y_{p2})$ is used as the approximation line and the line connecting point $Q1(x_1, Y_{q1})$ and the point $Q2(x_2, Y_{q2})$ is used as the ideal A/D line. Further, if deeming that P1 is converted to Q and P2 to Q2 and that any point $Pa(x_a, y_{pa})$ on an approximation line is converted to a point $Qa(x_a, y_{qa})$ on the ideal A/D line, the proportional relation of equation (7) stands between the approximation line and the ideal A/D line.

$$(y_{pa}-y_{p1}):(y_{p2}-y_{p1})=(y_{qa}-y_{q1}):(y_{q2}-y_{q1}) \tag{7}$$

Further, the above equation (7) can be cleaned up to the following equation (8):

$$y_{qa} = (y_{pa} - y_{p1}) * \frac{y_{q2} - y_{q1}}{y_{p2} - y_{p1}} + y_{q1} \tag{8}$$

Here, returning to the TAD output characteristic of FIG. 2, at the two ends of the area 1 and area 2, the approximation lines are converted to the ideal A/D line as shown in Table 2:

TABLE 2

|  | Approximation line | Ideal A/D line |
|---|---|---|
| Area 1 | MIN | MIN |
|  | C | (MAX + MIN)/2 |
| Area 2 | C | (MAX + MIN)/2 |
|  | MAX | MAX |

Therefore, by entering the values of the two ends of the lines for the areas shown in Table 2 into equation (8), a conversion equation (linear correction equation) is obtained for converting a TAD output value X on the approximation line to a corrected value H on the ideal A/D line as shown in the following equation (9):

< Area 1 > Case where MIN ≤ X ≤ C  (9)

$$\text{Corrected value } H = (X - \text{MIN}) * \frac{(\text{MAX} + \text{MIN})/2 - \text{MIN}}{(C - \text{MIN})} + \text{MIN}$$

< Area 2 > Case where C < X ≤ MAX $$\text{Corrected value } H = (X - C) * \frac{\text{MAX} - (\text{MAX} + \text{MIN})/2}{(\text{MAX} - C)} + (\text{MAX} + \text{MIN})/2$$

Further, when actually performing A/D conversion at the TAD 70, the equation (9) is applied using the actual TAD output as X, whereby the corrected value H after linear correction of the actual TAD output (X) is output as the final A/D conversion result after linear correction. The correction equation setting unit 27 fetches the three reference TAD outputs of MIN, C, and MAX set in the register 16 to set the linear correction equation (9).

Further, when the linear correction equation (9) is set by the correction equation setting unit 27, the reference voltage selection unit 18 outputs to the switching logic 11 an instruction for activating only the three-state analog switch 7 corresponding to the actual voltage for A/D conversion. After this, this state is continued for a predetermined period. The TAD 70 receives as input the voltage for A/D conversion through the three-state analog switch 7.

Further, the actual TAD output for the input voltage is temporarily stored in the signal output unit 19 in the register 16 and the stored actual TAD output is linearly corrected by the correction operation unit 26. The linear correction by the correction operation unit 26 is performed in accordance with the linear correction equation set in the correction equation setting unit 27, that is, the equation (9), whereby the actual TAD output (X) is corrected to the corrected value H.

Here, the information on the sampling clock CK and the current temperature is reflected in the three reference TAD output values (MIN, C, and MAX) as it is, so the linear correction by equation (9) becomes suitable correction for the sampling clock CK and the current temperature at that time.

In the present embodiment, by configuring the system to fetch the reference TAD output periodically (or at a timing where A/D conversion is performed), a linear correction equation (9) is set immediately corresponding to fluctuations in the sampling clock CK or ambient temperature and therefore suitable linear correction is performed. As a specific example of periodic fetching of output, for example, the method may be considered of fetching output at a shorter period than the presumed temperature fluctuations considering the state of temperature change presumed in the environment in which the TAD 70 is installed.

Further, the fluctuation of the sampling clock CK referred to here is not the fluctuation of the sampling clock CK during A/D conversion, but the change in the sampling clock CK at the time of powering up of the system. That is, even when using linear correction by the linear correction equation (9) for A/D conversion by for example a 1 MHz sampling clock CK or for A/D conversion by a 10 MHz sampling clock CK, there is no longer a need to detect the difference in the sampling clock CK.

Figure 4:
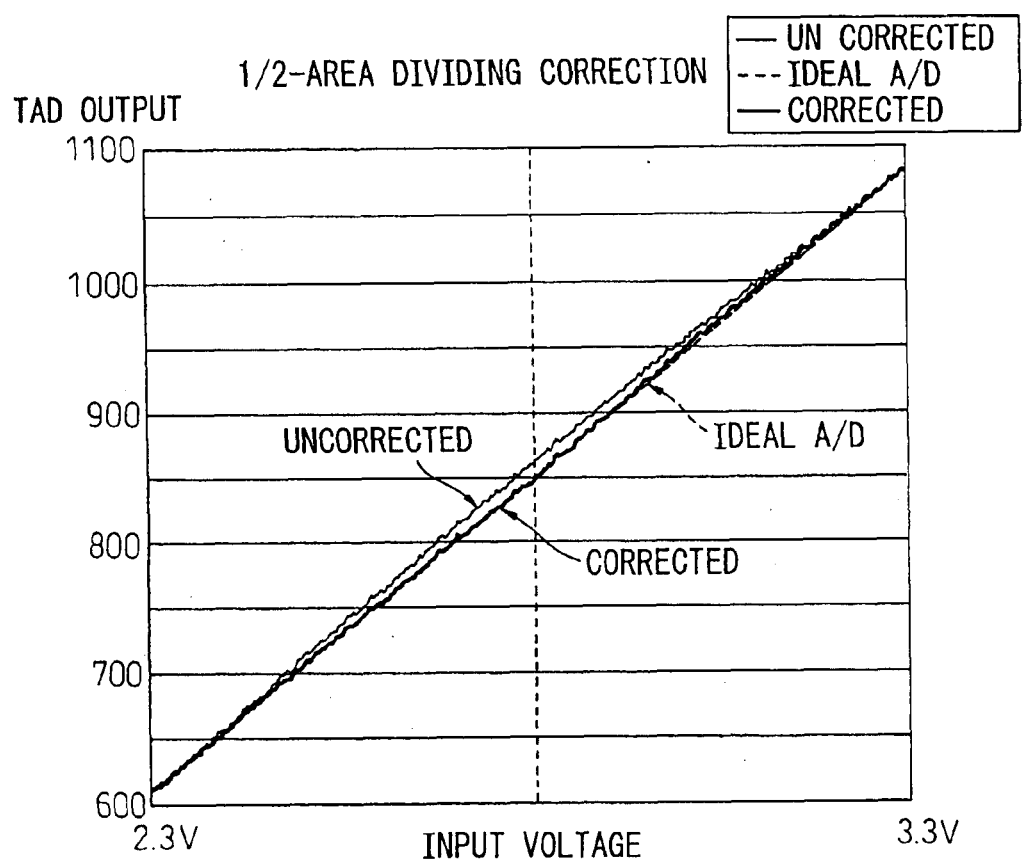
FIG. 4 is a graph of the TAD output characteristic after linear correction in the first embodiment.

FIG. 4 shows an example of the TAD output characteristic in the case of linear correction of the present embodiment. As illustrated, when linear correction is not performed (that is, when the actual TAD output is left as it is), like in the already explained FIG. 21, the non-linear error with respect to the ideal A/D line is large, while when linear correction is performed, a state substantially overlapping with the ideal A/D line results. The linear correction effect of the present embodiment is clearly expressed as a result.

As explained in detail above, in the A/D conversion system with a correction function of the present embodiment, the input voltage range from the minimum voltage Vmin to the maximum voltage Vmax is equally divided into the area 1 and area 2 about the center voltage Vc and the TAD output characteristic curve of the actual output characteristic from the TAD 70 is approximated as the approximation line L11 or L12 in each area. Further, the conversion equation from the approximation lines L11 and L12 to the ideal A/D line (in this example, the line connecting the coordinate points of the TAD outputs for Vmin and Vmax) is set as the linear correction equation (9).

For this setting, the reference voltages Vmin, Vc, and Vmax are input into the TAD 70 in advance before the actual A/D conversion to obtain the corresponding reference TAD outputs MIN, C, and MAX and the linear correction equation of equation (9) is set based on the same. Further, by computing using the actual TAD output value as the correction value X in the linear correction equation (9), the corrected value H after linear correction is obtained.

Therefore, according to the A/D conversion system with a correction function of the present embodiment, it is possible to linearly correct a characteristic with a good precision by a suitable linear correction equation in accordance with the temperature at that time or the sampling clock CK without regard as to changes in the ambient temperature or differences in the sampling clock CL. Further, since the linear correction is just by computation in accordance with the linear correction equation (9), the correction unit 3 can be configured more simply compared with the method of storing correction values in a correction use ROM like in the related art and therefore linear correction can be realized at a lower cost.

Further, in the present embodiment, since the input voltage range is equally divided into two, it is possible to configure the linear correction equation by a relatively simple equation compared with the case of equal division into three or more or division into areas of different lengths and therefore it is possible to suppress an increase in the time for linear correction or greater complexity of the circuit configuration.

Further, in the present embodiment, since the correction unit 3 is configured in the same FPGA, a reduction of size of the correction unit 3 and in turn a reduction in size of the A/D conversion system 1 as a whole become possible and the degree of freedom of installation of the system 1 is increased. Here, the correspondence between the components of the present embodiment and the components of the present invention will be clarified. In the present embodiment, the reference voltage input unit 2 corresponds to the reference signal input unit of the present invention, the correction equation setting unit 27 corresponds to the conversion equation deriving unit of the present invention, and the correction computation unit 26 corresponds to the data converting unit of the present invention. Further, the TAD 70 is one example of the A/D converter. The detecting means of the present invention is comprised of the latch and encoder 73, the counter 74, the latch 75, the latch 76, and the subtractor 77 in it.

Second Embodiment

Figure 5:
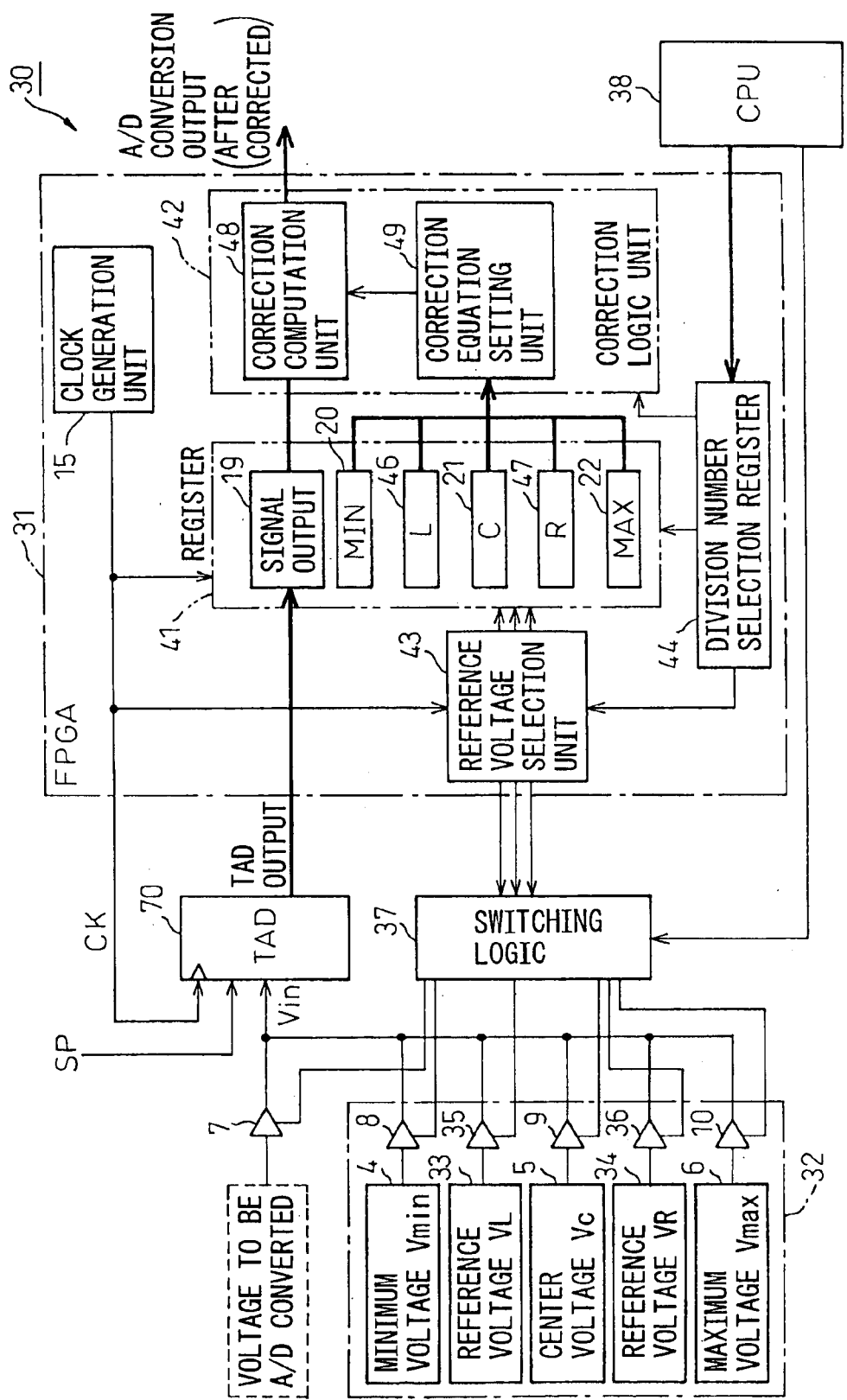
FIG. 5 is a block diagram of the general configuration of an A/D conversion system with a correction function according to a second embodiment of the present invention.

In the first embodiment, the explanation was given of the example of equally dividing the input voltage range into two and setting a linear correction equation for each area 1 and 2 for linear correction. In the second embodiment, an explanation will be given of an example of equally dividing the range into four and setting a linear correction equation for each of the four areas for linear connection. FIG. 5 is a block diagram of the general configuration of an A/D conversion system with a correction function of the present embodiment. In FIG. 5, components the same as the A/D conversion system 1 with a correction function of FIG. 1 are assigned the same reference numerals as in FIG. 1 and detailed explanations thereof are omitted.

As shown in FIG. 5, the A/D conversion system 30 with a correction function of the present embodiment is further set with the reference voltage VL and the reference voltage VR in addition to the three reference voltages the same as in the first embodiment (Vmin, Vc, and Vmax) as reference voltages for setting the linear correction equation. Specifically, the reference voltage input unit 32 of the present embodiment is provided with, in addition to the configuration of the reference voltage input unit 32 of the first embodiment, a first reference voltage generation unit 33 for generating the reference voltage VL and a second voltage generation unit 34 for generating the reference voltage VR. Further, it is provided with three-state analog switches 35 and 36 corresponding to these reference voltage generation units 33 and 34.

Further, the switching logic 37 activates only one of the three-state analog switches 7 to 10, 35, and 36 in accordance with an instruction from the reference voltage selection unit 43. The register 41 forming the correction unit 31, in addition to the configuration of the register 16 of the first embodiment (see FIG. 1), is provided with a first reference voltage storage unit 46 for storing the TAD output L for the reference voltage VL and a second reference voltage storage unit 47 for storing the TAD output R for the reference voltage VR. Further, the correction logic unit 42 sets the linear correction equation based on the MIN, L, C, R, and MAX stored in the storage units 19 to 22, 46, and 47 and linearly corrects the actual TAD outputs in accordance with the linear correction equation.

Figure 6:
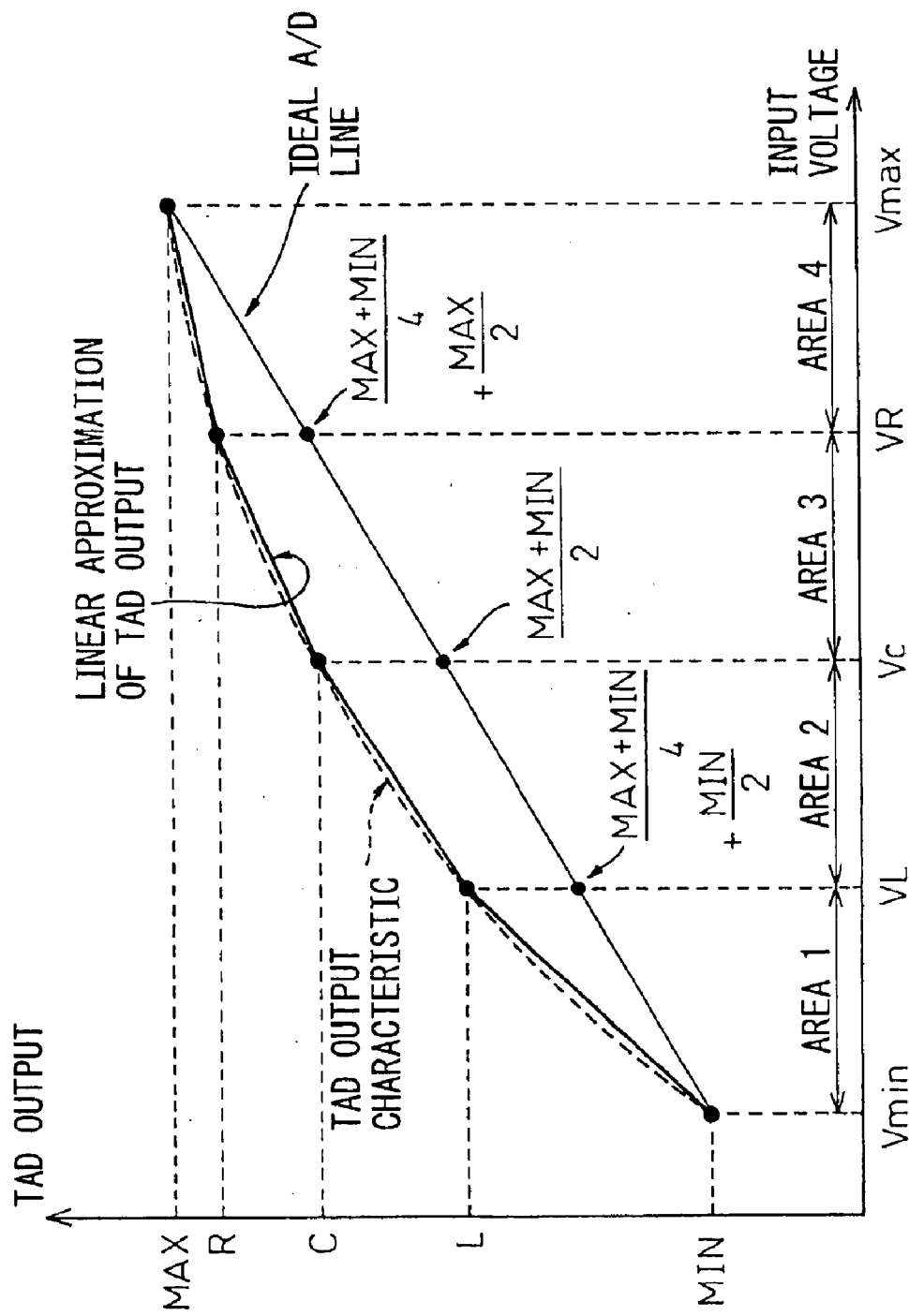
FIG. 6 is a graph of the TAD output characteristic in the second embodiment.

That is, in the present embodiment, as shown by the TAD output characteristic of FIG. 6, the input voltage range is equally divided into four. The reference voltage VL is an intermediate value between the minimum voltage Vmin and the center voltage Vc, while the reference voltage VR is the intermediate value between the center voltage Vc and the maximum voltage Vmax. Further, the TAD output characteristic curve is approximated for each area by a line connecting the two ends of the characteristic curve in each area (approximation line).

That is, in the area 1, the curve is approximated by the approximation line connecting the coordinate point express-ing the TAD output MIN for the minimum voltage Vmin and the coordinate point expressing the TAD output L for the reference voltage VL, in the area 2, the curve is approximated by the approximation line connecting the coordinate point expressing the TAD output L for the reference voltage VL and the coordinate point expressing the TAD output C for the center voltage Vc, in the area 3, the curve is approximated by the approximation line connecting the coordinate point expressing the TAD output C for the center voltage Vc and the coordinate point expressing the TAD output R for the reference voltage VR, and in the area 4, the curve is approximated by the approximation line connecting the coordinate point expressing the TAD output R for the reference voltage VR and the coordinate point expressing the TAD output MAX for the maximum voltage Vmax.

On the other hand, a line having a TAD output characteristic directly proportional to the input voltage is set as the ideal A/D line. In the present embodiment as well, in the same way as the first embodiment, a line connecting the coordinate points showing the TAD output for the minimum voltage Vmin and the maximum voltage Vmax is made the ideal A/D line.

Further, a conversion equation (linear correction equation) for converting any coordinate point on an approximation line to a coordinate point on the ideal A/D line at the same input voltage value as that coordinate point is derived for each area 1 to 4. The linear correction equation is derived (set) by the correction equation setting unit 49 in the correction logic 42.

The principle of conversion of coordinate points from the approximation lines to the ideal A/D line in the present embodiment is completely the same as that explained based on FIG. 3 in the first embodiment. By applying equation (8) to the areas 1 to 4, a linear correction equation such as shown in equation (10) is obtained:

$$<\text{Area 1}> \text{ Case where MIN} \le X \le L \qquad (10)$$

Corrected value $H =$ $$(X - \text{MIN}) * \frac{(\text{MAX} + \text{MIN})/4 - \text{MIN}/2}{(L - \text{MIN})} + \text{MIN}$$

$<\text{Area 2}>$ Case where $L < X \le C$

Corrected value $H =$ $$(X - L) * \frac{(\text{MAX} + \text{MIN})/4 - \text{MIN}/2}{(C - L)} + (\text{MAX} + \text{MIN})/4 + \text{MIN}2$$

$<\text{Area 3}>$ Case where $C < X \le R$

Corrected value $H =$ $$(X - C) * \frac{\text{MAX}/2 - (\text{MAX} + \text{MIN})/4}{(R - C)} + (\text{MAX} + \text{MIN})/2$$

$<\text{Area 4}>$ Case where $R < X \le \text{MAX}$

Corrected value $H = (X - R) * \frac{\text{MAX}/2 - (\text{MAX} + \text{MIN})/4}{(\text{MAX} - R)} +$ $$(\text{MAX} + \text{MIN})/2 + \text{MAX}/2$$

That is, in the present embodiment, before the actual A/D conversion, by having the reference voltage selection unit 43 output instructions for controlling the three-state analog switches 8, 9, 10, 35, and 36 other than the three-state analog switch 7 corresponding to the A/D conversion voltage to the switching logic 37, one of the reference voltages Vmin, VL, Vc, VR, and Vmax is successively input to the TAD 70.

Further, if the TAD outputs for the reference voltages are stored in corresponding storage units in the register 41, the correction equation setting unit 49 fetches the reference TAD outputs MIN, L, C, R, and MAX stored in the storage units 20, 21, 22, 46, and 47 and sets a linear correction equation expressed by equation (10).

After setting the linear correction equation, only the three-state analog switch 7 corresponding to the A/D conversion voltage is activated by the instruction from the reference voltage selection unit 43. After this, this state is continued for a certain period until the linear correction equation is reset. The actual TAD output for the input voltage during this time is stored once in a signal output unit 19 in the register 41. The stored actual TAD output is linearly corrected by the correction operation unit 48. The linear correction by the correction operation unit 48 is performed in accordance with the linear correction equation set in the correction equation-setting unit 49, that is, the above equation (10). The actual TAD output (X) is corrected to the corrected value H.

Figure 8:
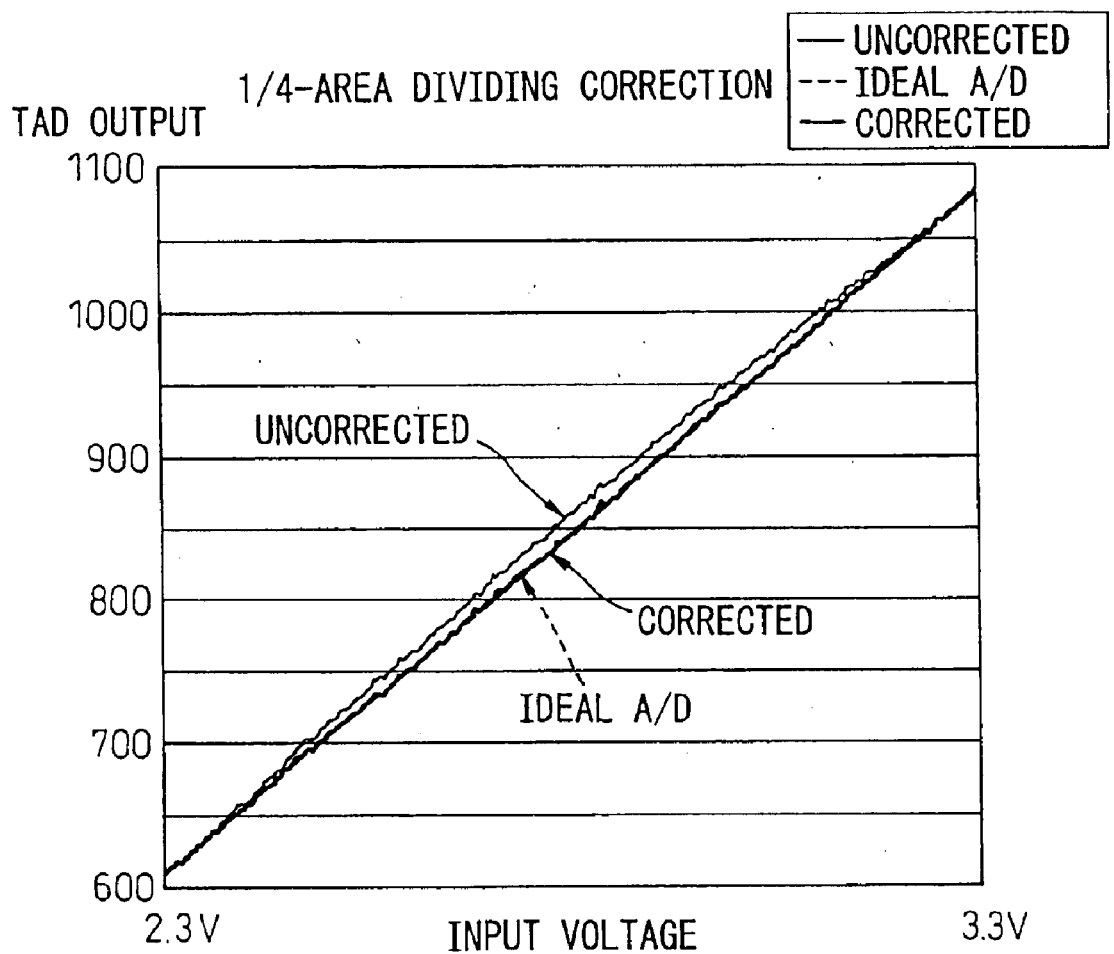
FIG. 8 is a graph of the TAD output characteristic after linear correction in the second embodiment.

FIG. 8 shows an example of the TAD output characteristic in the case of linear correction of the present embodiment (equal division into four). As illustrated, the result is a state substantially overlapping with the ideal A/D line due to linear correction. The linear correction effect of the present embodiment is clearly expressed as a result. In more detail, compared with the case of equally dividing the input voltage range into two as in the first embodiment, the non-linear error is reduced in the case of equal division into four (see FIG. 11).

The explanation up to here presumed equal division of the input voltage range into four and setting a linear correction equation for each area as shown in FIG. 6, but the A/D conversion system 30 with a correction function of the present embodiment is configured to enable the input voltage range to be equally divided into two or equally divided into four.

Specifically, a selection value of either equal division into two or equal division into four is written into the division number selection register 44 in the correction unit 31 from an external CPU 38. Further, the reference voltage selection unit 43, register 41, and correction logic unit 42 operate based on the selection value written in. Here, when equal division into four is selected (written), the operation as explained above is performed.

On the other hand, when equal division into two is selected, the reference voltage selection unit 43 outputs an instruction for successively inputting into the TAD 70 only the minimum voltage Vmin, center voltage Vc, and maximum voltage Vmax as reference voltages in the reference voltage input unit 32. The register 41 also operates to store the TAD outputs for these three reference voltages Vmin, Vc, and Vmax. The first reference voltage storage unit 46 and second reference voltage storage unit 47 substantially do not operate in this state. Further, the correction equation setting unit 49 in the correction logic 49 also fetches the three reference TAD outputs MIN, C, and MAX and sets a linear correction equation of equation (9) explained in the first embodiment. Due to this, the correction operation unit 48 executes a linear correction operation by the linear correction equation of equation (9).

Figure 7:
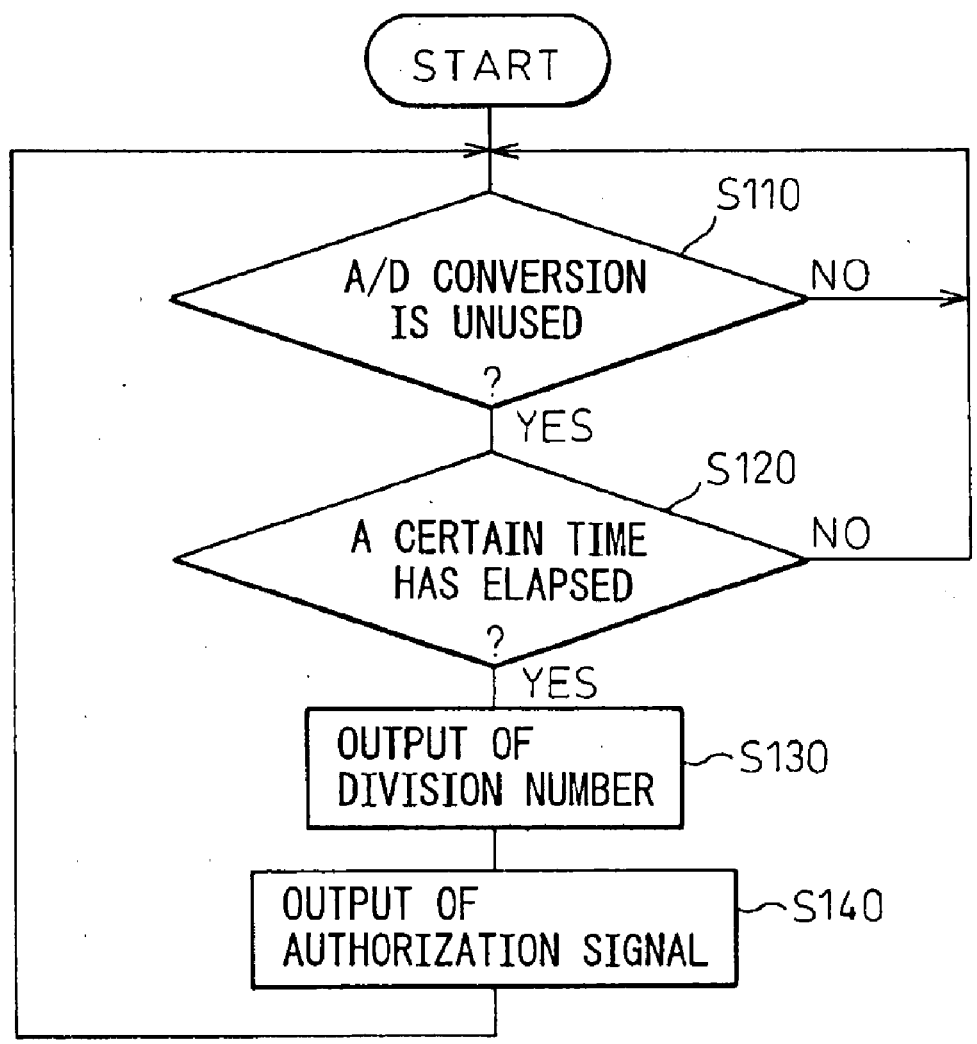
FIG. 7 is a flow chart of the processing for setting the number of areas divided into in the second embodiment.

That is, when equal division into two is selected as the number of areas divided into from the CPU 38, the A/D conversion system 30 with a correction function shown in FIG. 5 substantially operates and functions as an A/D conversion system 1 with a correction function of the first embodiment shown in FIG. 1. FIG. 7 is a flow chart of the area division number setting processing executed by the CPU 38. In this embodiment, the CPU 38 reads out an area division number setting processing program from a not shown ROM and executes the processing in accordance with the program. The area division number setting processing is performed continuously after the A/D conversion system is powered up.

When this processing is started, first, at step (hereinafter abbreviated as "S") 110, it is judged if the A/D conversion is still unused, that is, if A/D conversion has been performed for an actual voltage for A/D conversion. At this time, while A/D conversion is actually being performed and there is actual TAD output from the TAD 70, it is judged "NO" and S110 is repeated, but if A/D conversion is not being performed (that is, if unused in state), the routine proceeds to step 120 where it is judged if a certain time has elapsed. Here, the time elapsed after output of an authorization signal at S140 is judged.

This "certain time" may be suitably set, but it is preferably made a period shorter than the presumed temperature fluctuation considering for example the state of temperature changes assumed in advance for the environment in which the TAD 70 is installed. At this time, if the certain time has still not elapsed from the output of the authorization signal of S140, the routine returns again to S110, but when the certain time has elapsed, the routine proceeds to S130, where the number of areas divided into (equal division into two or equal division into four) is output to the division number selection register 44. Further, at the next S140, the authorization signal is output to the switching logic 37, then the routine returns again to S110. Note that the number of areas divided into can be set in advance and selected manually (by manual input etc.) by a user etc. The CPU 38 executes processing of S130 based on this set information.

The switching logic 37 deactivates all analog switches and prevents input to the TAD 70 while there is no authorization signal from the CPU 38, but when the authorization signal is input, operates to activate one of the three-stage analog switches in accordance with an instruction from the reference voltage selecting unit 43.

As already explained, the reference voltage selecting unit 43 successively performs the operation, for each reference voltage, of confirming that the TAD output corresponding to the reference voltage making input to the TAD 70 valid is stored in the register 41 and activates the input of another reference voltage to the TAD 70 and stores the necessary reference TAD output (for example, in the case of equal division into two, MIN, C, MAX) in the register 41.

Further, in the present embodiment, it was made possible to select either equal division into two or equal division into four, but this is only one example. It is also possible to make it possible select from more types of numbers divided into. According to the A/D conversion system 30 with a correction function of the embodiment explained above, since the input voltage range is equally divided into four areas and a linear correction equation is set for linear correction of the TAD output characteristic curve for each area, the non-linear error can be reduced more than the case of equal division into two areas explained in the first embodiment (see FIG. 11). However, the greater the number divided into, the more complicated the circuits for forming the system become. Therefore, the number of areas divided into should be suitably set considering the balance between the two aspects of the circuit configuration and correction precision.

Further, in the present embodiment, by providing the division number selecting register, it is possible to select the number of areas divided into by a control signal from the CPU 38. Therefore, it becomes possible to convert the precision of linear correction. Further, in the present embodiment, the CPU 38 corresponds to the division number setting means of the third mode. Further, the processing of S130 in the area division number setting processing of FIG. 7 corresponds to the processing executed by the division number setting means of the third mode.

Third Embodiment

In the first and second embodiments, the TAD output characteristic curve was linearly approximated for each area and a conversion equation for converting from the approximation line to an ideal A/D line was made the linear correction equation, but in the third embodiment, rather than linear approximation, first the TAD output characteristic as a whole is approximated by a second order curve and a conversion equation for converting from the approximated second order curve (approximation curve) to the ideal A/D line is made the linear correction equation.

Figure 9:
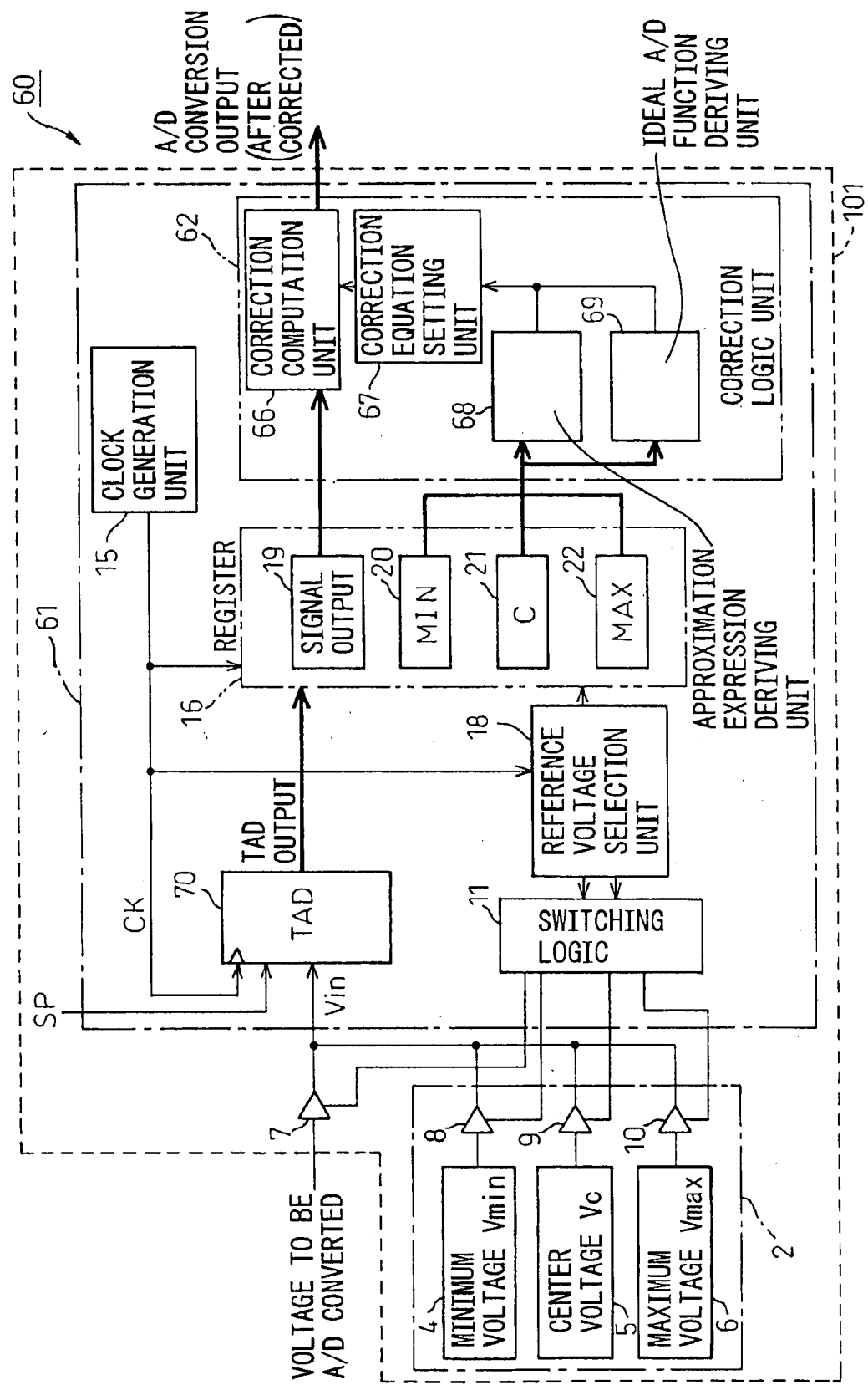
FIG. 9 is a block diagram of the general configuration of an A/D conversion system with a correction function according to a third embodiment of the present invention.

FIG. 9 shows the general configuration of an A/D conversion system with a correction function of the present embodiment. As shown in FIG. 9, the A/D conversion system 60 with a correction function of the present embodiment, when compared with the A/D conversion system 1 with a correction function of the first embodiment explained in FIG. 1, has a different configuration of the correction logic 62 and has the TAD 70 and switching logic 11 configured in the same FPGA in addition to the clock generation unit 15, the register 16, the reference voltage selection unit 18, and the correction logic unit 62 to form a single A/D converter 61 with a correction function, but otherwise is the same as the A/D conversion system 1 with a correction function of the first embodiment. Therefore, components the same as in FIG. 1 will be assigned the same reference numerals and explanations thereof will be omitted. The setting of the linear correction equation in the correction logic unit 62 will be explained in detail below.

Figure 10:
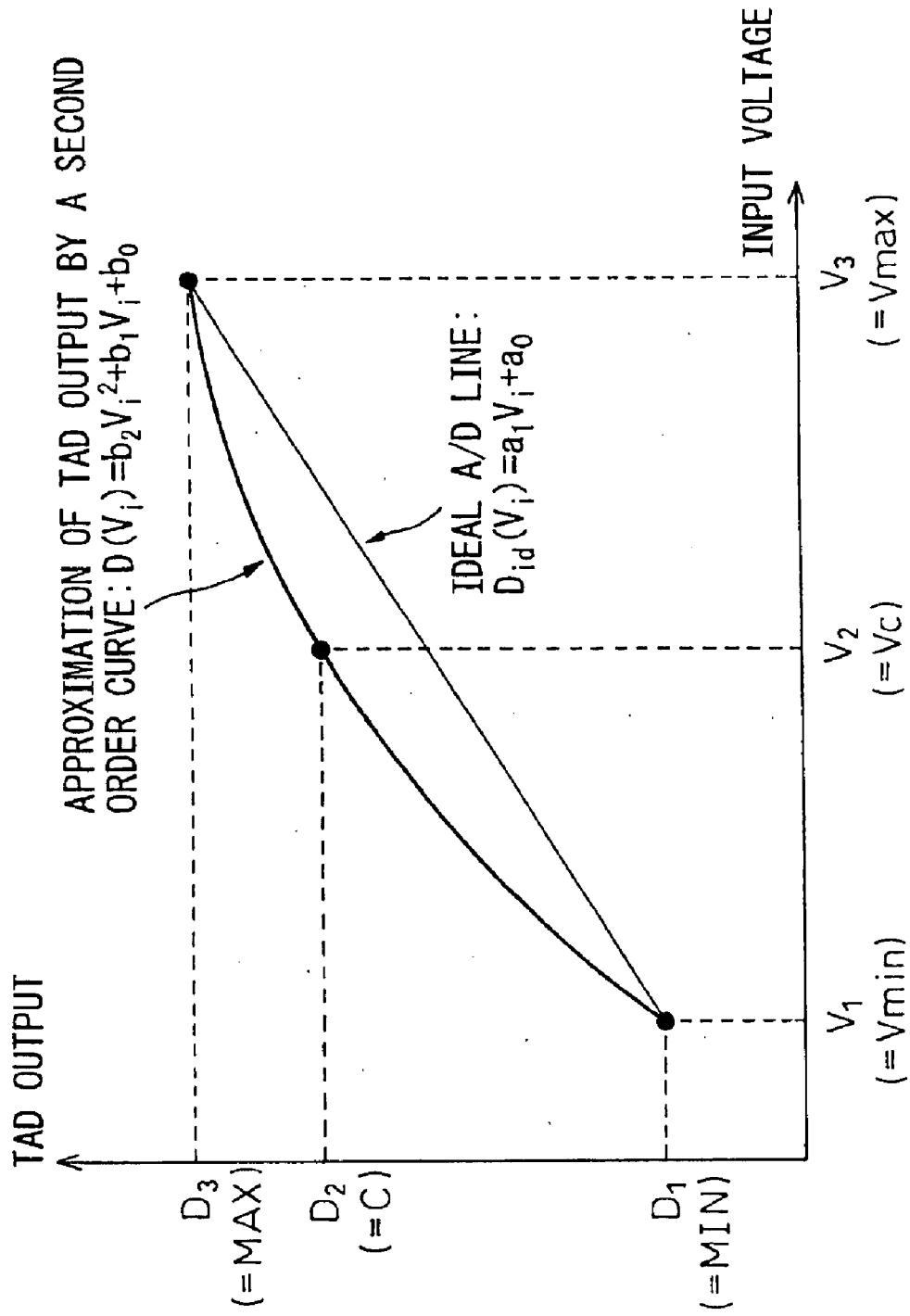
FIG. 10 is a graph of the TAD output characteristic in the third embodiment.

FIG. 10 is a graph of the TAD output characteristic of the present embodiment. In this embodiment as well, like in the first embodiment, first, the TAD outputs D1, D2, and D3 are obtained using as reference voltages any three voltages V1, V2, and V3 in the input voltage range and stored in the register 16. That is, information relating to three coordinate points on the TAD output characteristic curve is obtained.

35 The reference voltages V1, V2, and V3 of the present embodiment are the same as the reference voltages Vmin, Vc, and Vmax of the first embodiment. Therefore, the TAD outputs D1, D2, and D3 for the reference voltages are also MIN, C, and MAX the same as the reference TAD outputs of the first embodiment.

The approximation equation deriving unit 68 approximates the TAD output characteristic curve by a second order curve (curve expressed by second order polynomial) as explained below based on the information of the three coordinate points. In the present example, the Lagrange interpolation formula is used to derive the approximation curve (second order polynomial) passing through the above three coordinate points.

That is, the TAD outputs for the three reference voltages V1, V2, and V3 are D1, D2, and D3, so the second order curve passing through these three coordinate points is expressed by equation (11):

$$D(V_i) = b_2 V_i^2 + b_1 V_i + b_0 \quad (11)$$

where, $$b_2 = -\frac{1}{(V_1 - V_2)(V_3 - V_1)} D_1 - \frac{1}{(V_1 - V_2)(V_2 - V_3)} D_2 - \frac{1}{(V_2 - V_3)(V_3 - V_1)} D_3$$

$$b_1 = \frac{V_2 + V_3}{(V_1 - V_2)(V_3 - V_1)} D_1 - \frac{V_3 + V_1}{(V_1 - V_2)(V_2 - V_3)} D_2 - \frac{V_1 + V_2}{(V_2 - V_3)(V_3 - V_1)} D_3$$

$$b_0 = -\frac{V_2 V_3}{(V_1 - V_2)(V_3 - V_1)} D_1 - \frac{V_3 V_1}{(V_1 - V_2)(V_2 - V_3)} D_2 - \frac{V_1 V_2}{(V_2 - V_3)(V_3 - V_1)} D_3$$

On the other hand, in the present embodiment as well, the line connecting the coordinate points showing the TAD outputs for the minimum voltage V1 (=Vmin) and the maximum voltage V3 (=Vmax) is made the ideal A/D line. Therefore, based on the information of the two coordinate points, the first order function expressing the ideal A/D line is expressed as in equation (12). Equation (12) expressing this ideal A/D line is derived by the ideal A/D function deriving unit 69.

$$D_{id}(V_i) = a_1 V_i + a_0 \quad (12)$$

where, $$a_i = \frac{D_3 - D_1}{V_3 - V_1}, \quad a_0 = D_1 - \frac{D_3 - D_1}{V_3 - V_1} V_1$$

That is, the approximation equation deriving unit 68 actually derives the coefficient values $b_0$, $b_1$, and $b_2$ in equation (11), while the ideal A/D function deriving unit 69 actually derives the coefficient values $a_1$ and $a_0$ in equation (12). Further, the correction equation setting unit 67 sets the linear correction equation expressed by equation (13) by the method explained in FIG. 19 and equations (3) to (5) based on the equations (11) and (12) derived above.

$$\text{Corrected value } H = \frac{a_1}{2b_2}\left(-b_1 \pm \sqrt{b_1^2 - 4(b_0 - X)b_2}\right) + a_0 \quad (13)$$

Figure 11:
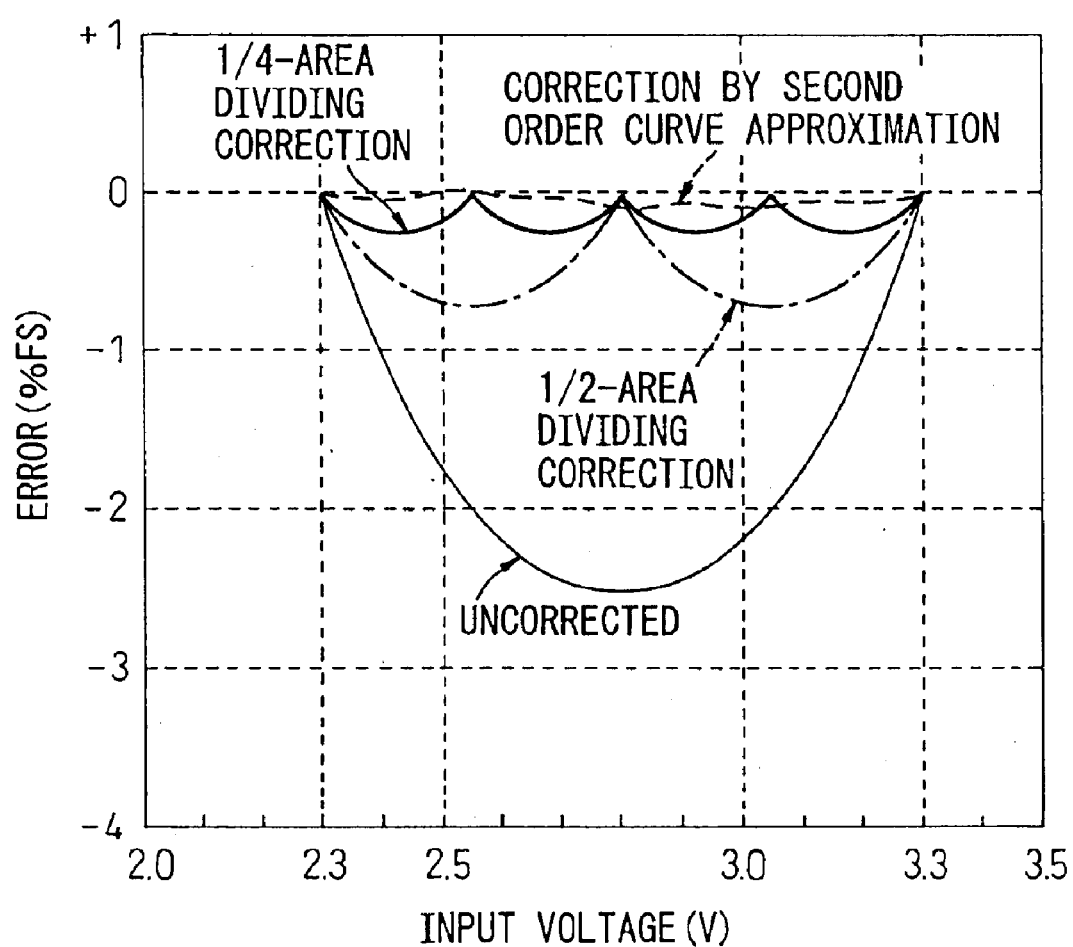
FIG. 11 is a graph of non-linear error after line correction in the first to third embodiments.

Further, the correction operation unit 66 outputs the actual TAD output linearly corrected in accordance with the linear correction equation (13) set at the correction equation setting unit 67. As explained above, in the present embodiment, first the TAD output characteristic curve is approximated by a second order curve (second order polynomial) and a conversion equation for converting this approximation curve to an ideal A/D line (linear correction equation) is obtained. FIG. 11 shows an example of non-linear error in the case of linear correction by the method of the present embodiment (second order curve approximation), the case of linear correction by the method of the first embodiment (linear approximation by equal division into two), and the case of linear correction by the method of the second embodiment (linear approximation by equal division into four).

As illustrated, the non-linear error becomes smaller with linear correction based on linear approximation by equal division into four compared with linear correction based on linear approximation by equal division into two, but the non-linear error is reduced more by linear correction based on the second order curve approximation of the present embodiment. Therefore, according to the A/D conversion system 60 with a correction function of the present embodiment, in the same way as in the first and second embodiments, it becomes possible to linearly correct a curve with a good precision by a suitable linear correction equation in accordance with the temperature at that time and the sampling clock CK without regard as to temperature changes or changes in the sampling clock CK.

Further, unlike linearly approximating the TAD output characteristic curve as in the first and second embodiments, the input/output characteristic curve is approximated by a second order polynomial in accordance with M number (in this example three) coordinate points obtained by actual A/D conversion and the linear correction equation is derived based on this, so linear correction of a relatively higher precision compared with the above embodiments becomes possible.

Further, in the present embodiment, the TAD output characteristic curve was approximated by a second order curve obtained based on three coordinate points, but the invention is of course not limited to this. However, if an actual TAD output characteristic curve is approximated by a second order curve, the level is substantially sufficient. Further, three coordinate points are sufficient for obtaining a second order curve (second order polynomial). Therefore, if approximating a characteristic by a second order curve based on three coordinate points as in the present embodiment, it becomes possible to simplify the circuit configuration for realizing linear correction while maintaining the precision of the linear correction.

Here, in this embodiment, the approximation equation deriving unit 68 corresponds to the polynomial deriving unit of the present invention, while the ideal A/D function deriving unit 69 corresponds to the ideal input/output characteristic line setting unit of the present invention.

Fourth Embodiment

In the third embodiment, the approximation equation deriving unit 68 derived the second order polynomial expressed by equation (11). That is, equation (11) expressed the TAD output by a second order function of the input voltage. Due to this, the correction equation setting unit 67 sets a linear correction equation expressed by equation (13), that is, a correction equation including a square root extraction operation. By performing an operation other than the fundamental four arithmetic operations in this way, the configuration of the correction operation unit 66 ends up becoming complicated.

Therefore, in the fourth embodiment, the second order polynomial expressing the approximation curve in the third embodiment is made the second order polynomial expressed by the following equation (14) instead of equation (11):

$$V(D_i) = c_2 D_i^2 + c_1 D_i + c_0 \tag{14}$$

That is, the input voltage Vi is expressed by a second order function of the TAD output. By deriving the second order polynomial as in equation (14), the correction equation setting unit 67 sets the linear correction equation expressed by the following equation (15) based on this equation (14) and equation (12) expressing the ideal A/D line:

$$\text{Corrected value } H = a_1(c_2 X^2 + c_1 X + c_0) + a_0 \tag{15}$$

Equation (15) does not include a square root extraction operation such as the linear correction equation of the third embodiment and is expressed by just the fundamental four arithmetic operations. The rest of the configuration other than the approximation equation deriving unit 68 and the correction equation setting unit 67 is completely the same as the third embodiment. Therefore, according to the present embodiment, by expressing the second order polynomial expressing the approximation curve as shown in equation (14), it is possible to obtain a linear correction equation able to be realized by only the fundamental four arithmetic operations such as in equation (15), so the specific circuit configuration for realizing linear correction can be realized more simply.

Further, the linear correction equation (13) of the third embodiment includes a double sign, so it is necessary to judge which sign is taken. There is no problem if it is known if the TAD output characteristic bulges upward or bulges downward, but if it is not known, then a mistaken correction operation will be performed depending on which sign is selected. As opposed to this, the linear correction equation (15) of the present invention does not include a double sign, so the above problem is not liable to occur and provision of a more reliable A/D conversion system with a correction function becomes possible.

Fifth Embodiment

In the first embodiment, the ideal A/D line was made the line connecting the coordinate points expressing the TAD output for the minimum voltage of the input voltage range and the TAD output for the maximum voltage. In the fifth embodiment, the configuration of the system as a whole is similar to the first embodiment. However, for the ideal A/D line, unlike in the first embodiment, the explanation will be given of the example of setting an ideal A/D line not intersecting with the TAD output characteristic curve in the input voltage range.

Figure 12:
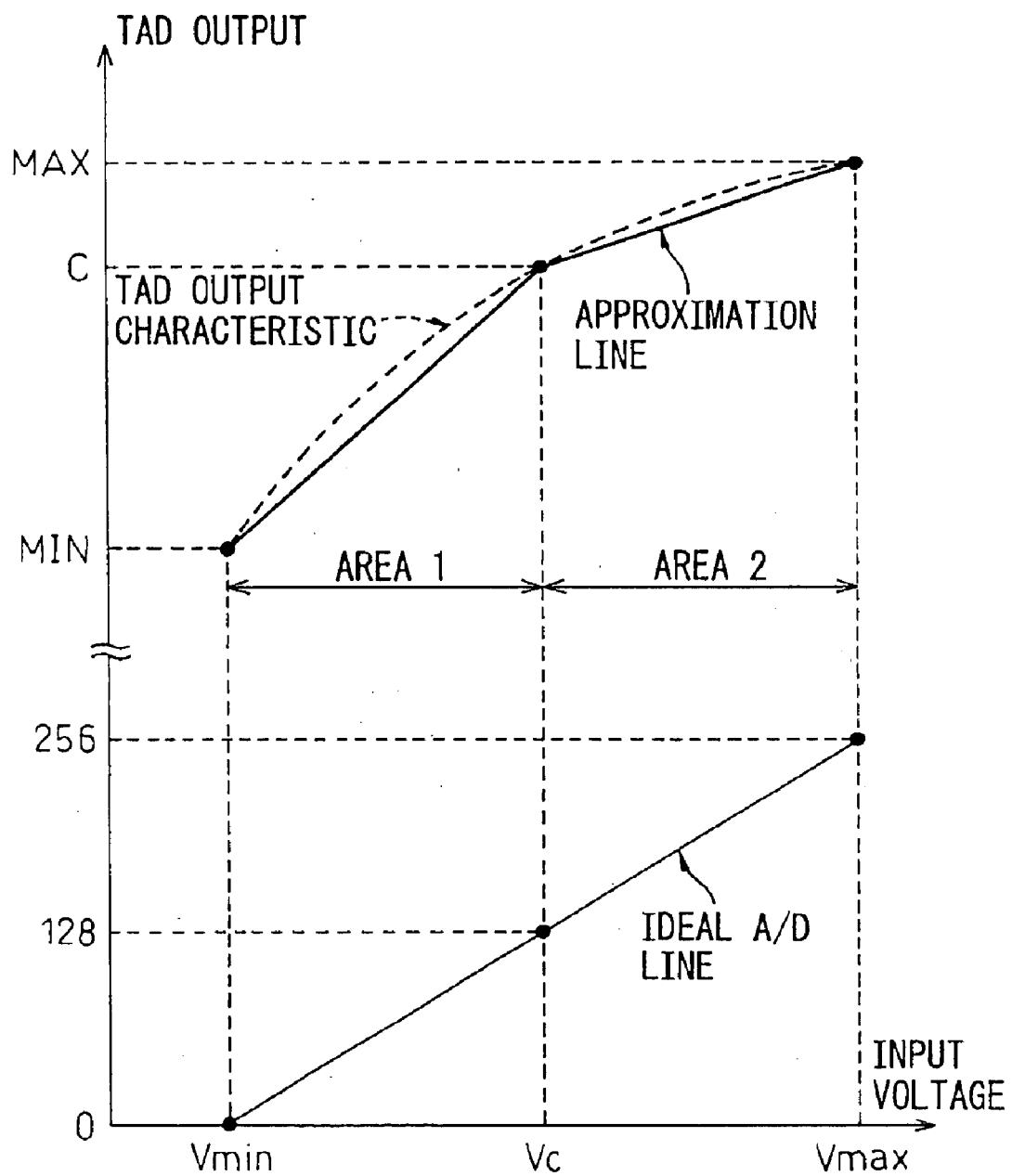
FIG. 12 is a graph of the TAD output characteristic in the fifth embodiment.

That is, as shown in FIG. 12, while the TAD output range of the TAD output characteristic curve is in the range of MIN to MAX, the ideal A/D line is made a level lower than that. In the present embodiment, specifically, the ideal A/D line is set so that the TAD output for the minimum voltage Vmin becomes 0 and the TAD output for the maximum voltage Vmax becomes 256.

That is, by making the final result of A/D conversion after linear correction in the range of 0 to 256, it is attempted to use the A/D conversion system with a correction function of the present embodiment as an 8-bit A/D converter. In this case, in the area 1 and area 2, the conversion from an approximation line to the ideal A/D line is performed as in the following Table 3.

TABLE 3

|  | Approximation line | Ideal 8-bit A/D line |
|---|---|---|
| Area 1 | MIN | 0 |
|  | C | 128 (=256/2) |
| Area 2 | C | 128 |
|  | MAX | 256 |

Therefore, by entering the values of the two ends of the lines of each area shown in Table 3 in equation (8), a linear correction equation as shown in equation (16) is obtained:

$$< \text{Area 1} > \quad \text{Case where MIN} \leq X \leq C \tag{16}$$

$$\text{Corrected value } H = (X - \text{MIN}) * \frac{128}{(C - \text{MIN})}$$

$$< \text{Area 2} > \quad \text{Case where } C < X \leq \text{MAX}$$

$$\text{Corrected value } H = (X - C) * \frac{128}{(\text{MAX} - C)} + 128$$

Therefore, according to the present embodiment, regardless of the length of the output data from the TAD 70, use as an 8-bit A/D converter is possible, so it becomes possible to provide an A/D converter with a broader range of applications. Further, in the above example, the minimum value of the ideal A/D line was made 0 and the maximum value 256, but the invention is not limited to this. It is possible to set these to any values so long as the difference between the maximum value and the minimum value is 8 bits length. Further, in the above example, the explanation was given of the example of 8-bit output, but 8-bit output is only one example. It is possible to obtain a linear correction equation by a similar method even with another number of bits. For example, if desiring 10-bit output, the ideal A/D line should be set so that the difference between the minimum value and maximum value of the ideal A/D line becomes 10 bits (1024).

Above, the explanation was given of embodiments of the present invention, but the present invention is not limited in any way by these embodiments. Various modes can be taken so long as in the technical scope of the present invention. For example, in the first and second embodiments, the approximation curves in the areas were all made lines connecting two ends of the TAD output characteristic curves in those areas, but with the TAD 70, in general, the A/D conversion precision tends to become poorer the closer to the ends of the input voltage range. Therefore, among the areas divided, for the areas including the minimum value and the maximum value of the input voltage range (in the first embodiment, the areas 1 and 2 in the second embodiment, the areas 1 and 4), the curves are not made approximation lines connecting with a point showing the maximum values (or minimum value) of the input voltage. Rather, for example as shown in FIG. 13, the approximation curve is made the line connecting a coordinate point other than the maximum value and minimum value of the input voltage in the input voltage range and a coordinate point of a boundary part with an adjoining area.

Figure 13:
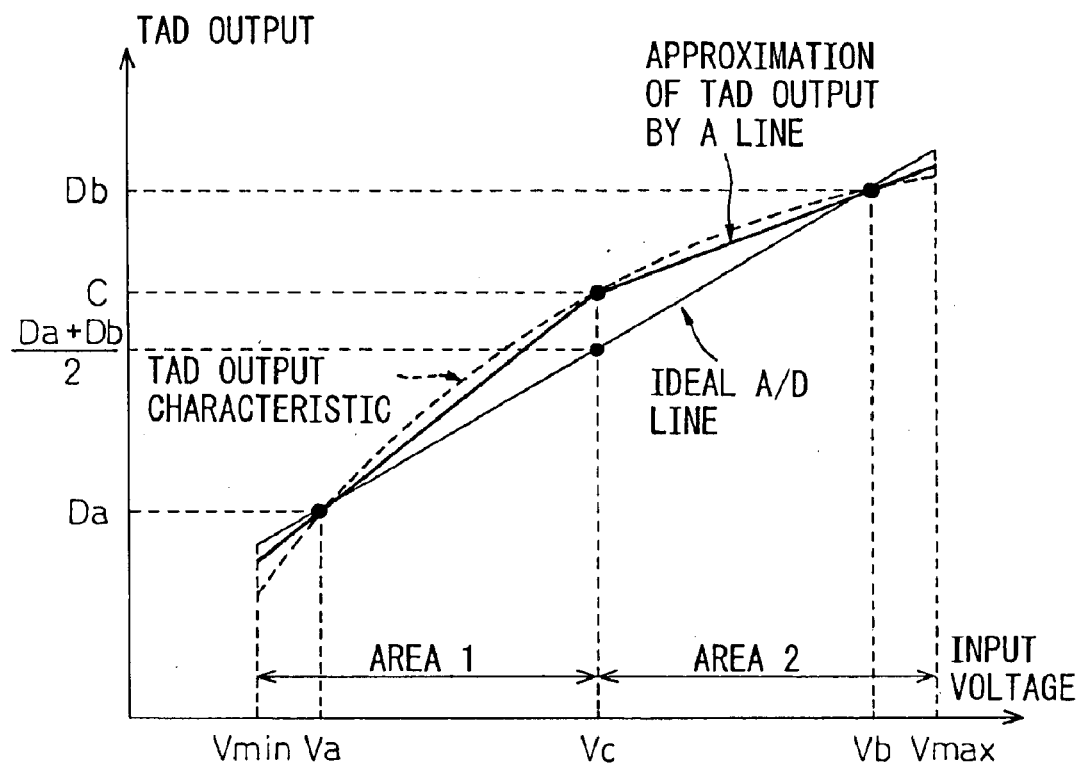
FIG. 13 is a graph of another example of setting an approximation line of the first embodiment.

That is, in the example of FIG. 13, in the area 1, it is made the approximation line connecting the coordinate points (Va,Da) and (Vc,C), while in the area 2, it is made the approximation line connecting the coordinate points (Vc,C) and (Vb,Db). Further, the linear correction equation in the case of setting the approximation curve in this way, unlike in equation (9), is expressed by equation (17):

<Area 1> Case where MIN ≤ X ≤ C  (17)

Corrected value $H = (X - Da) * \frac{(Da + Db)/2 - Da}{(C - Da)} + Da$

<Area 2> Case where C < X ≤ MAX

Corrected value $H = (X - C) * \frac{Db - (Da + Db)/2}{(Db - C)} + (Da + Db)/2$

Figure 14:
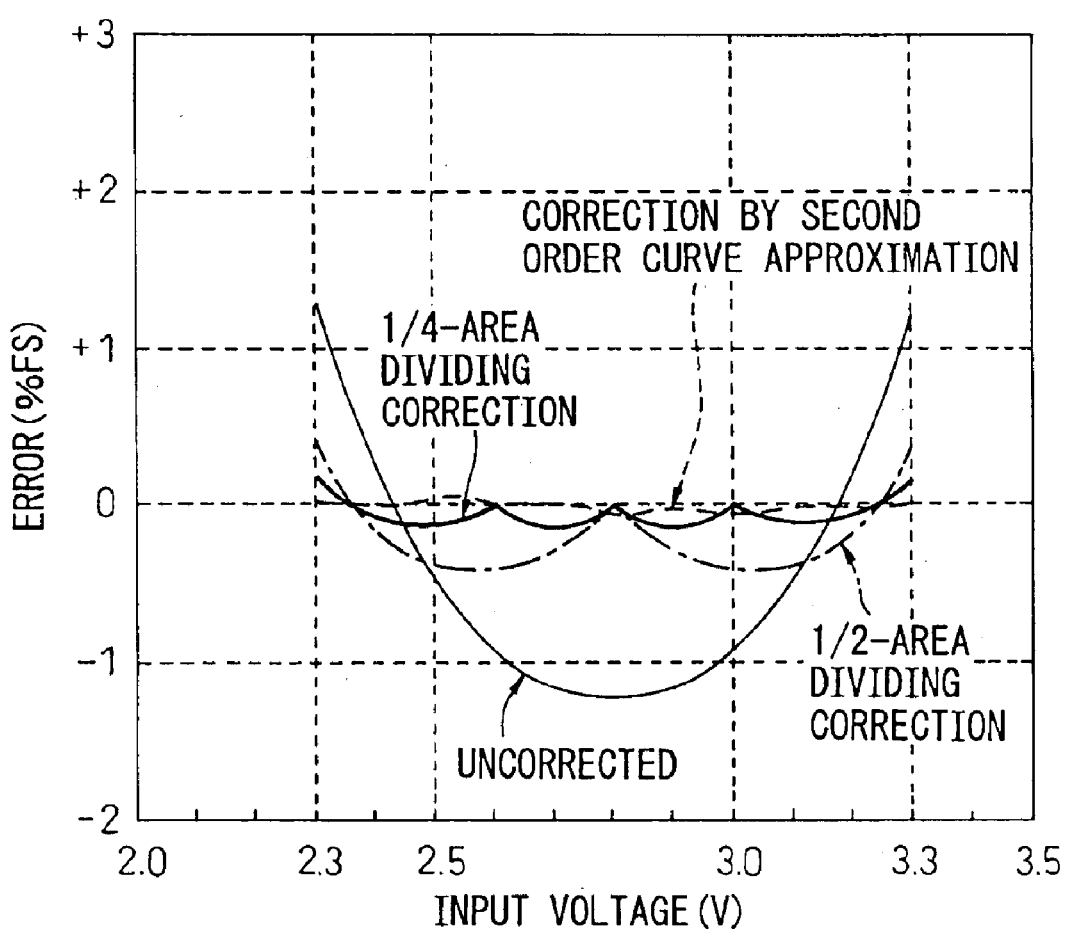
FIG. 14 is a graph of the non-linear error in the case of using points other than the two ends of the input voltage range as reference voltages.

Further, as clear from FIG. 13 as well, in the present example, in the area 1, the TAD output characteristic is smaller than the ideal A/D line in the range where the input voltage is smaller than Va, while conversely the TAD output characteristic is larger than the ideal A/D line in the range where the input voltage is larger than Va. In the area 2 as well, there is a similar trend around the input voltage Vb. Therefore, while the non-linear error leaned toward the negative side with linear correction of the first embodiment, as shown in FIG. 11, the non-linear error after linear correction by equation (17) is reduced in positive or negative leaning as shown in FIG. 14 and therefore the absolute value of the error also becomes smaller.

The same applies the case of linear approximation by equal division into four in the second embodiment. By approximating the characteristic by a line connecting coordinate points other than the two ends of the input voltage range in the area 1 and area 4, it is possible to reduce the positive and negative leaning of the non-linear error as shown in FIG. 14 and reduce the absolute value of the error.

Further, in the case of the third embodiment as well, the coordinate points at the two ends of the input range were used for deriving the second order polynomial, but a higher precision second order curve approximation becomes possible if deriving the equation using any three points other than the two ends. Further, in the first and second embodiments, the explanation was given taking as examples equal division into two and equal division into four, but the number divided into may be freely determined. The larger the number divided into, the more the non-linear error can be reduced. However, the larger the number divided into, the more complicated the circuit configuration for realizing the linear correction, so the number divided into may be determined considering the balance between the complexity of configuration and the correction precision. Further, the areas need not necessarily be equally divided.

However, if the widths of the areas differ, the conversion equation from an approximation line to the ideal A/D line will end up becoming complicated and therefore the time taken for the linear correction will increase or the circuit configuration for realizing linear correction will end up becoming complicated. Therefore, preferably, as shown in the first or second embodiment, the areas are divided so as to become the same in length (input voltage length).

Further, the conversion equations (9) and (10) from approximation lines to ideal A/D line (linear correction equations) explained in the first and second embodiments may also be derived utilizing the method of derivation of a conversion equation from a second order curve to a line explained in the third embodiment. That is, it is possible to express both of an approximation curve and ideal A/D line by functions and derive the equation utilizing for example equation (2) from the relationship of the two. The methods may differ, but the linear correction equations which are obtained are the same.

Further, in the first and second embodiments, only the correction unit was configured in one FPGA, but the invention is not limited to this. It is also possible to configure the TAD 70 or switching logic as well in the same FPGA as in for example the third embodiment. Further, the FPGA is just one example. For example, the invention can also be realized by an ASIC, CPLD, or other various ICs. Further, as shown by the broken line in FIG. 9 of the third embodiment, it is also possible to configure the A/D conversion system 60 with a correction function in a single semiconductor integrated circuit 101 (IIC). By doing this, it becomes possible to make the system 60 as a whole smaller and lower in cost. The same applies to the A/D conversion systems 1 and 30 with correction functions of the first embodiment (FIG. 1) and second embodiment (FIG. 5). The systems 1 and 30 may also be made integrated ICs.

Further, in the above embodiments, the explanation was given of the example of linear correction of the output from the TAD 70, but the digital data for linear correction is of course not limited to TAD output. The invention can be applied to all sorts of A/D converters having nonlinear output characteristics.

While the invention has been described with reference to specific embodiments chosen for purpose of illustration, it should be apparent that numerous modifications could be made thereto by those skilled in the art without departing from the basic concept and scope of the invention.

What is claimed is:

1. A method of Correction of A/D converted output data for correcting digital data obtained by A/D conversion of an analog signal, comprising the steps of:

forming at least a first order approximation polynomial curve approximating an input/output characteristic curve of A/D conversion in a predetermined input range of said analog signal, setting an ideal input/output characteristic line corresponding to said input/output characteristic curve of A/D conversion in said predetermined input range of said analog signal, deriving a conversion equation for converting coordinates of a point on said approximation polynomial curve to coordinates of a point on said ideal input/output characteristic line corresponding to the same analog signal value, and converting said A/D converted digital data by said conversion equation.

2. A method of correction of A/D converted output data as set forth in claim 1, wherein said step of forming said approximation polynominal curve is comprised of a step of dividing a predetermined input range of said analog signal into a plurality of areas and a step of connecting the two ends of said input/output curve in each area to form an approximation line.

3. A method of correction of A/D converted output data as set forth in claim 2, wherein each of said approximation lines in an area including a minimum value and an area including a maximum value in said analog signal input range among said areas is made a line connecting any coordinate point other than the two ends of said input/output characteristic curves in said area and a boundary point with another adjoining area instead of a line connecting said two ends.

4. A method of correction of A/D converted output data as set forth in claim 2, wherein the lengths of the analog signals in the areas are all the same.

5. A method of correction of A/D converted output data as set forth in claim 1, wherein said step of forming said approximation polynomial curve forms said input/output characteristic curve as an approximation curve expressed by at least a second order and not more than an (M−1) order polynomial based on any M number of coordinates on said input/output characteristic curve.

6. A method of correction of A/D converted output data as set forth in claim 5, wherein said polynomial is a second order equation.

7. A method of correction of A/D converted output data as set forth in claim 6, wherein said second order equation is expressed by the second order function $x = c_0 + c_1 y + c_2 y^2$ where said analog signal is x and said digital data is y, $c_0$, $c_1$, and $c_2$.

8. A method of correction of A/D converted output data as set forth in claim 5, wherein said M number of coordinate points are coordinate points other than the two ends of said analog signal input range.

9. A method of correction of A/D converted output data as set forth in claim 1, wherein said ideal A/D line is set so that the difference between digital data for the minimum value of the analog signal and the digital data for the maximum value of the analog signal in said analog signal input range becomes a preset predetermined bit length.

10. An apparatus for correction of A/D converted output data for correcting digital data obtained inputting an analog signal to an A/D converter, comprising:

a reference signal input unit for inputting a plurality of analog signal values as reference signals to said A/D converter in a predetermined input range of said analog signal, an approximation polynomial curve forming unit for obtaining at least a first order approximation polynomial curve for approximating an input/output characteristic curve of said A/D conversion based on reference digital data output from said A/D converter for input of said reference signals, an ideal input/output characteristic line setting unit for setting an ideal input/output characteristic line corresponding to said input/output characteristic curve of said A/D conversion in said predetermined input range of said analog signal, a conversion equation deriving unit for deriving a conversion equation for converting coordinates of a point on said approximation polynomial curve to coordinates of a point on said ideal input/output characteristic line corresponding to the same analog signal value, and a data converting unit for converting digital data output from said A/D converter, by said conversion equation.

11. An apparatus for correction of A/D converted output data as set forth in claim 10, wherein said reference signal input unit divides said predetermined input range of said analog signal into a plurality of areas, uses the minimum value and the maximum value of said analog signal in said predetermined range and the values of boundary points of said areas as reference signals, and inputs them to said A/D converter, while said approximation polynomial curve forming unit obtains an approximation line approximating the input/output characteristic curve of said A/D conversion for each area based on said reference digital data obtained for input of said reference signals.

12. An apparatus for correction of A/D converted output data as set forth in claim 11, wherein said reference signal inputting unit uses as said reference signal value instead of the minimum value of said analog signal an analog signal value other than the minimum value of said analog signal smaller than all other reference signals and uses as said reference signal value instead of the maximum value of said analog signal an analog signal other than the maximum value of said analog signal larger than all other reference signals.

13. An apparatus for correction of A/D converted output data as set forth in claim 11, further comprising a division setting means able to set any number of areas.

14. An apparatus for correction of A/D converted output data as set forth in claim 10, wherein said reference signal input unit inputs M number of analog signal values of a predetermined input range of said analog signal as reference signals to said A/D converter, while said approximation polynomial curve calculating unit obtains an approximation curve expressed by at least a second order and not more than an (M−1) order polynomial approximating the input/output characteristic curve of said A/D conversion based on reference digital data output from said A/D converter.

15. An apparatus for correction of A/D converted output data as set forth in claim 14, wherein said reference signal input unit inputs three analog signal values to said A/D converter as reference signals, while said polynomial deriving unit derives a second order polynomial as said polynomial.

16. An apparatus for correction of A/D converted output data as set forth in claim 14, wherein said reference signal input unit inputs analog signal values other than the minimum value and maximum value in said analog signal input range as said reference signals to said A/D converter.

17. An apparatus for correction of A/D converted output data as set forth in claim 10, formed in a single semiconductor integrated circuit.

18. An apparatus for correction of A/D converted output data as set forth in claim 17, formed in a single semiconductor integrated circuit including also said A/D converter.

19. An apparatus for correction of A/D converted output data as set forth in claim 10, wherein:

said A/D converter is comprised of:

a pulse delay circuit comprised of a plurality of serially connected delay units for outputting a pulse signal delayed by a delay time in accordance with the voltage level of said analog signal and transferring a pulse signal while successively delaying it by the delay times of said delay units and a detecting means for detecting the number of said delay units which said pulse signal passes through in a preset sampling period and outputs the detection result of said detecting means as said digital data as an A/D conversion result for said analog signal, and said data converting means converts digital data from said A/D converter in accordance with said conversion equation.

20. An A/D conversion system comprising:

an A/D converting unit for converting an analog signal to digital data, a reference signal input unit for inputting a plurality of analog signal values as reference signals to said A/D converting unit in a predetermined input range of said analog signal, an approximation polynomial curve forming unit for obtaining an approximation polynomial curve for approximating an input/output characteristic curve of said A/D conversion based on reference digital data output from said A/D converting unit for input of said reference signal, an ideal input/output characteristic line setting unit for setting an ideal input/output characteristic line corresponding to said input/output characteristic curve of said A/D conversion in said predetermined input range of said analog signal, a conversion equation deriving unit for deriving a conversion equation for converting coordinates of a point on said approximation polynomial curve to coordinates of a point on said ideal input/output characteristic line corresponding to the same analog signal value, and a data converting unit for converting digital data output from said A/D converting unit by said conversion equation.

* * * * *